(12) United States Patent
Inomata et al.

(10) Patent No.: US 7,989,223 B2
(45) Date of Patent: Aug. 2, 2011

(54) METHOD OF USING SPIN INJECTION DEVICE

(75) Inventors: Kouichiro Inomata, Sendai (JP); Nobuki Tezuka, Sendai (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 213 days.

(21) Appl. No.: 12/320,677

(22) Filed: Feb. 2, 2009

(65) Prior Publication Data

US 2009/0180308 A1    Jul. 16, 2009

Related U.S. Application Data

(62) Division of application No. 10/538,689, filed as application No. PCT/JP2003/015888 on Dec. 11, 2003, now Pat. No. 7,675,129.

(30) Foreign Application Priority Data

Dec. 13, 2002   (JP) .................................. 2002-363127
Dec. 26, 2002   (JP) .................................. 2002-378502
Jul. 7, 2003    (JP) .................................. 2003-271628
Dec. 9, 2003    (JP) .................................. 2003-410966

(51) Int. Cl.
    *H01L 21/00*    (2006.01)
(52) U.S. Cl. ..... 438/3; 257/295; 257/495; 257/E21.665; 360/324.12; 360/324.2; 365/158
(58) Field of Classification Search .................. 257/295, 257/421, E21.665; 360/324.12, 324.2; 365/158; 438/3

See application file for complete search history.

(56) References Cited

U.S. PATENT DOCUMENTS

| 2003/0002230 A1 | 1/2003 | Dee et al. |
| 2003/0011944 A1 | 1/2003 | Hosomi |
| 2003/0072110 A1 | 4/2003 | Dee |

FOREIGN PATENT DOCUMENTS

EP        1 085 586 A2    3/2001
(Continued)

OTHER PUBLICATIONS

T. Miyazaki et al.; "Spin polarized tunneling in ferromagnet / insulator / ferromagnet junctions" Elsevier, Journal of Magnetism and Magnetic Material, vol. 151, (1995), pp. 403-410.

(Continued)

*Primary Examiner* — Wael M Fahmy
*Assistant Examiner* — John C Ingham
(74) *Attorney, Agent, or Firm* — Westerman, Hattori, Daniels & Adrian, LLP

(57) ABSTRACT

A spin injection device capable of spin injection magnetization reversal at low current density, a magnetic apparatus using the same, and magnetic thin film using the same, whereby the spin injection device (14) including a spin injection part (1) comprising a spin polarization part (9) including a ferromagnetic fixed layer (26) and an injection junction part (7) of nonmagnetic layer, and a ferromagnetic free layer (27) provided in contact with the spin injection part (1) is such that in which the nonmagnetic layer (7) is made of either an insulator (12) or a conductor (25), a nonmagnetic layer (28) is provided on the surface of the ferromagnetic free layer (27), electric current is flown in the direction perpendicular to the film surface of the spin injection device (14), and the magnetization of the ferromagnetic free layer (27) is reversed. This is applicable to such various magnetic apparatuses and magnetic memory devices as super gigabit large capacity, high speed, non-volatile MRAM and the like.

18 Claims, 25 Drawing Sheets

FOREIGN PATENT DOCUMENTS

| | | |
|---|---|---|
| JP | 9-251621 A | 9/1997 |
| JP | 2002-92824 | 3/2002 |

OTHER PUBLICATIONS

J. C. Slonczewski; "Current-driven excitation of magnetic multilayers", ELSEVIER, Journal of Magnetism and Magnetic Material, vol. 159 (1996), pp. L1-L7.

J. A. Katine et al.; "Current-driven magnetization reversal and spin-wave excitations in Co/Cu/Co Pillars", Physical Review Letters, vol. 83, No. 14, Apr. 3, 2000, pp. 3149-3152.

T. Ambrose et al.; "Magnetic properties of single crystal $Co^2MnGe$ Heusler alloy films", Journal of Applied Physics, vol. 87, No. 9, May 1, 2000, pp. 5463-5465.

T. Block et al.; "Spin polarized tunneling at room temperature in a Heusler Compound—A non-oxide material with a large negative magnetoresistance effect in low magnetic fields" J. Appl. Phys. 76.

Grollier et al. "Field Dependence of Magnetization Reversal by Spin Transfer" Physical Review B 67, 174402 (2003).

Diao et al. "Spin Transfer Switching and Spin Polarization in Magnetic Tunnel Junctions with MgO and AlOx Barriers" Applied Physics Letters 87, 232502 (2005).

(a)

(b)

US 7,989,223 B2

METHOD OF USING SPIN INJECTION DEVICE

CROSS REFERENCE TO RELATED APPLICATION

This application is a divisional of application Ser. No. 10/538,689, filed on Jun. 10, 2005, which is a 371 of PCT/JP2003/15888 filed on Dec. 11, 2003, which is incorporated herein by reference.

TECHNICAL FIELD

The present invention relates to a functional device controlling electronic spin, especially a spin injection device to make possible the magnetization reversal by spin injection with lower current density and to be utilized for ultra-gigabit large capacity, high speed, non-volatile magnetic memory, spin injection magnetic apparatus using the same, and spin injection magnetic memory device.

The present invention relates also to a magnetic thin film of large spin polarizability, and a magnetoresistance effect device and a magnetic device using the same.

BACKGROUND ART

In recent years, giant magnetoresistance (GMR) effect devices consisting of ferromagnetic layer/nonmagnetic metal layer/ferromagnetic layer and ferromagnetic spin tunnel junction (MTJ) devices consisting of ferromagnetic layer/insulating layer/ferromagnetic layer have been developed, and are expected for application to new magnetic field sensors and magnetic memories (MRAM).

GMR can bring about giant magnetoresistance effect by controlling magnetization of two ferromagnetic layers mutually parallel or antiparallel by external magnetic field, due to the fact that resistances differ from each other by spin dependent scattering at an interface. On the other hand, MTJ can bring about so-called tunnel magnetoresistance (TMR) effect, such that the magnitudes of tunnel currents in the direction perpendicular to layer surface differ from each other by controlling magnetization of two ferromagnetic layers mutually parallel or antiparallel by external magnetic field (Refer, for example, to T. Miyazaki and N. Tezuka, "Spin polarized tunneling in ferromagnet/insulator/ferromagnet junctions", (1995), J. Magn. Magn. Mater., L39, p. 1231).

Tunnel magnetoresistance TMR depends upon spin polarizability P at the interface of the ferromagnet and the insulator that are used, and is known to be expressed in general by Equation (1), assuming the spin polarizabilities of two ferromagnets as $P_1$ and $P_2$, respectively.

$$TMR=2P_1P_2/(1-P_1P_2) \qquad (1),$$

where spin polarizability P of a ferromagnet has a value $0<P \leq 1$. The highest tunnel magnetoresistance TMR at room temperature so far obtained is about 50% in case of CoFe alloy of P~0.5.

GMR devices are already in practical use for magnetic heads of hard discs. MTJ devices are presently expected for application to magnetic heads of hard discs and non-volatile magnetic memories (MRAM). In MRAM, "1" and "0" are recorded by controlling two magnetic layers mutually parallel and antiparallel which make up each MTJ device by arranging MTJ devices in matrix, and applying magnetic field by flowing electric current in the interconnection provided separately. The readout is conducted utilizing TMR effect. However, MRAM has such a problem to be solved that, when a device size is made small for large capacity, the electric current needed for magnetization reversal increases due to the increase of demagnetizing field, thereby the power consumption increases.

As a method to solve such a problem, the triple layer structure is proposed in which two magnetic layers combined mutually antiparallel via nonmagnetic metal layer (Synthetic Antiferromagnet, hereinafter referred to as "SyAF". Refer, for example, to the Japanese Patent Laid Application H9-251621A (1997)). By using such SyAF structure, the magnetic field needed for magnetization reversal is reduced even if a device size is made small, because of decrease of demagnetizing field.

On the other hand, a new spin reversal method not using current magnetic field is recently theoretically proposed, as disclosed by J. C. Slonczewski, "Current-driven excitation of magnetic multilayers", (1996), J. Magn. Magn. Mater., 159, L1-L7, and was also realized experimentally (Refer, for example, to J. A. Katine, F. J. Albert, R. A. Ruhman, E. B. Myers and D. C. Ralph, "Current-Driven Magnetization Reversal and Spin-Wave Excitations in Co/Cu/Co Pillars", (2000), Phy. Rev. Lett., 84, pp. 3149-3152).

Said spin reversal method is such that, in a triple layer structure consisting of the first ferromagnetic layer 101/nonmagnetic metal layer 103/the second ferromagnetic layer 105 as its principle is illustrated in FIG. 25, if the electric current flows from the second ferromagnetic layer 103 to the first ferromagnetic layer 101, spin polarized electrons are injected from the first ferromagnetic layer 101 via nonmagnetic metal layer 103 to the second ferromagnetic layer 105, and the spin of the second ferromagnetic layer 105 is reversed. It is called magnetization reversal by spin injection.

In said spin injection magnetization reversal of triple layer structure, if the spin of the first ferromagnetic layer 101 is assumed to be fixed, and if the spin is injected from the first ferromagnetic layer 101 via nonmagnetic metal layer 103, then the injected upward spin (majority spin) gives torque to the spin of the second ferromagnetic layer 105, and arranges said spin in one direction. Therefore, the spins of the first and the second ferromagnetic layer 101 and 105 become parallel. On the other hand, if the electric current flows in reverse direction, and the spin is injected from the second ferromagnetic layer 105 to the first ferromagnetic layer 101, then the downward spin (minority spin) is reflected at the interface between the first ferromagnetic layer 101 and nonmagnetic metal layer 103, the reflected spin gives torque to the spin of the second ferromagnetic layer 105, and tends to arrange said spin in one direction, namely, downward. As a result, the spins of the first and the second ferromagnetic layer 101 and 105 become antiparallel. Consequently, in said spin injection magnetization reversal of triple layer structure, the spins of the first and the second ferromagnetic layer can be made parallel or antiparallel by switching the direction of current.

In recent years, giant magnetoresistance (GMR) effect devices consisting of multiplayer film of ferromagnetic layer/nonmagnetic metal layer, tunnel magnetoresistance effect devices consisting of ferromagnetic layer/insulating layer/ferromagnetic layer, and ferromagnetic spin tunnel junction (MTJ) devices have been drawing attentions as new magnetic field sensors and non-volatile magnetic random access memory (MRAM) devices.

As giant magnetoresistance effect devices, that of CIP (Current In Plane) structure of the type to flow electric current in film plane and that of CPP (Current Perpendicular to the Plane) structure of the type to flow electric current in the direction perpendicular to film plane are known. The principle of a giant magnetoresistance effect device is a spin dependent scattering at the interface of a magnetic and a nonmagnetic layers, and, in general, GMR is larger in a giant magnetoresistance effect device of CPP structure than in that of CIP structure.

In such a giant magnetoresistance effect device, a spin valve type is used which inserts an antiferromagnetic layer near one side of ferromagnetic layer, and fix the spin of the ferromagnetic layer. In case of the spin valve type giant magnetoresistance effect device of CPP structure, since the electric resistance of antiferromagnetic layer is higher than GMR film by about two orders as 200 μΩcm, GMR effect is diluted, and the magnetoresistance of a spin valve type giant magnetoresistance effect device of CPP structure is as small as 1% or lower. Thereby, although a giant magnetoresistance effect device of CIP structure is already in practical use for a play back head of a hard disc, a giant magnetoresistance effect device of CPP structure is not yet practically used.

On the other hand, tunnel magnetoresistance effect devices and MTJ can exhibit so-called tunnel magnetoresistance (TMR) effect at room temperature, such that the magnitudes of tunnel currents in the direction perpendicular to layer surface differ from each other by controlling magnetization of two ferromagnetic layers mutually parallel or antiparallel by the external magnetic field (Refer, for example, to T. Miyazaki and N. Tezuka, "Spin polarized tunneling in ferromagnet/insulator/ferromagnet junctions", (1995), J. Magn. Magn. Mater., L39, p. 1231).

TMR devices are presently expected for application to magnetic heads of hard discs and non-volatile magnetic random access memories (MRAM). In MRAM, "1" and "0" are recorded by controlling two magnetic layers mutually parallel and antiparallel which make up each MTJ device by arranging MTJ devices in matrix, and applying magnetic field by flowing electric current in the interconnection provided separately. The readout is conducted utilizing TMR effect. However, MRAM has such a problem that, when a device size is made small for high density, the noise accompanying fluctuation of device's quality increases, and the value of TMR is so far insufficient. Therefore, the development of devices having larger TMR is required. As is seen from the Equation (1) above, by using a magnetic material of P=1, infinitely large TMR can be expected. A magnetic material of P=1 is called a half metal.

Such half metals are so far known from band structure calculation as such oxides as $Fe_3O_4$, $CrO_2$, $(La-Sr)MnO_3$, $Th_2MnO_7$, and $Sr_2FeMoO_6$, such half Heusler alloys as NiMnSb and others, and such full Heusler alloys with $L2_1$ structure as $CO_2MnGe$, $CO_2MnSi$, and $CO_2CrAl$. For example, it was reported that such conventional full Heusler alloys with $L2_1$ structure as $CO_2MnGe$ or others can be manufactured by heating a substrate to about 200° C., and making its film thickness to, in general, 25 nm or more by T. Ambrose, J. J. Crebs and G. A. Prinz, "Magnetic properties of single crystal $Co_2MnGe$ Heusler alloy films", (2000), Appl. Phys. Lett., Vol. 87, p. 5463.

It was recently reported that, according to the theoretical calculation of band structure, $Co_2Fe_{0.4}Cr_{0.6}Al$ in which a part of Cr as a constituting element of a half metal $Co_2CrAl$ is substituted with Fe is also a half metal of $L2_1$ type by T. Block, C. Felser, and J. Windeln, "Spin Polarized Tunneling at Room temperature in a Heusler Compound—a non-oxide Materials with a Large Negative Magnetoresistance Effect in Low Magnetic Fields", Apr. 28, 2002, Intermag Digest, EE01. But its thin film and tunnel junction have not been fabricated. Consequently, like conventional other $L2_1$ type compounds, it is not known experimentally at all whether its thin film shows half metal characteristics or large TMR properties.

However, though such a spin injection method is hopeful as a spin reversal method of nano-structure magnetic material in future, the current density required for magnetization reversal by spin injection is as quite high as $10^7$ $A/cm^2$ or higher, and this aspect was a practical problem to be solved.

Here, the present inventors discovered that magnetization reversal by spin injection can be obtained at lower current density by flowing electric current from a ferromagnetic layer via a nonmagnetic metal layer or an insulating layer provided separately to the triple layer structure in which two ferromagnetic layers are mutually connected antiparallel via a nonmagnetic metal layer.

Further, the present inventors also discovered that the functional effect similar to that mentioned above can be obtained by using, in place of the above-mentioned triple layer structure, a double layer structure consisting of a ferromagnetic free layer and a nonmagnetic layer, and a triple layer structure consisting of a ferromagnetic free layer, a nonmagnetic layer, and ferromagnetic layer.

Also, though giant magnetoresistance effect devices of CIP structure practically used at present for play back heads of conventional hard discs are being made microfabrication for high record density, insufficiency of signal voltage is predicted as a device is micro-fabricated, and higher quality of giant magnetoresistance effect devices of CPP structure is demanded instead of giant magnetoresistance effect devices of CIP structure, which so far has not been realized.

Except for the above-mentioned half metal $Co_2CrAl$, half metal thin films are fabricated, but it needs for it to heat a substrate at 300° C. or higher, or to anneal at 300° C. or higher after film forming at room temperature, but there have been no reports that the so far fabricated thin film is a half metal. The fabrication of tunnel junction devices using these half metals has been partly attempted, but TMR at room temperature is in all cases unexpectedly low, such that its maximum value is at most between 10 and 20% of the case using $Fe_3O_4$. As has been seen, the conventional half metal thin film requires the substrate heating or thermal treatment to attain its structure, and surface roughness increase or oxidation thereby may be considered as one of the causes for no large TMR attained. On the other hand, the thin film differs from bulk material in that it may not show half metal characteristics on the surface, and the half metal characteristics is sensitive to composition and the regularity of atomic alignment. The tunnel junction in particular has difficulty to attain the half metal electronic state at its interface. This is regarded as the cause for large TMR not attained. From the above, there remains a problem that the fabrication of half metal thin film is actually very difficult, and the half metal thin film good enough to be used for various magnetoresistance effect devices has so far not been obtained.

$Co_2CrAl$ and $CO_2Fe_{0.4}Cr_{0.6}Al$ thin film, which are predicted to be half metal from theoretical calculation of band structure, and the tunnel junction using said thin film have not been fabricated. In magnetic thin film material in general, a thin film and bulk material are particularly different in electronic state on their surface. Therefore, a half metal as bulk material is not guaranteed to be half metal as thin film. Even more, if the theoretical calculation of band structure shows a half metal, a half metal is not guaranteed to be obtained as an actual thin film. This is proved by the fact that the above-mentioned various half metals, so far indicated theoretically, have not been experimentally obtained. Therefore, like conventional full Heusler alloy as $L2_1$ type compound, it is totally unknown whether $CO_2CrAl$ and $CO_2Fe_{0.4}Cr_{0.6}Al$ thin film show experimentally half metal characteristics and large TMR property.

As mentioned above, there are many materials that are theoretically pointed out as a half metal, but none of them made into thin film have not shown half metal characteristics at room temperature. Therefore, there is a problem that large GMR from giant magnetoresistance effect devices of CPP structure at room temperature and large TMR from MTJ devices, which might be expected from half metal, have not been attained.

DISCLOSURE OF THE INVENTION

It is an object of the present invention to provide a spin injection device that is capable of spin injection magnetization reversal by lower electric current density, a magnetic apparatus and a magnetic memory device using said spin injection device.

In view of the problems mentioned above, it is also an object of the present invention to provide a magnetic thin film of high spin polarizability, and a magnetoresistance effect device and a magnetic device using the same. In order to achieve the objects mentioned above, a spin injection device comprises a spin injection part having a spin polarizing part and an injection junction part, and SyAF having a first magnetic layer and a second magnetic layer having different magnitudes of magnetization, and magnetically coupled together antiparallel to each other via a nonmagnetic layer, wherein: said SyAF and said injection junction part are bonded, and a spin polarization electron is injected from said spin injection part, and magnetization of said first and second magnetic layers is reversed while maintained in antiparallel state. In addition to the structure described above, the injection junction part of said spin injection part is either a nonmagnetic conductive layer or a nonmagnetic insulating layer. Said spin polarization electron is capable of spin conservation conduction or tunnel junction at the injection junction part of said spin injection part. The spin polarization part of said spin injection part is a ferromagnetic layer. The spin polarization part of said spin injection part is provided in contact with an antiferromagnetic layer that fixes the spin of a ferromagnetic layer. Further, the aspect ratio of the first and the second magnetic layers of SyAF in contact with the injection junction part of said spin injection parts may be less than 2. In such structure of a spin injection device, when a spin is injected from a spin polarization part via an injection junction part, the spin of SyAF is magnetization-reversed while maintaining antiparallel state. Therefore, the spin injection device of the present invention can exhibit magnetic reversal with lower current density.

A spin injection magnetic apparatus comprises a free layer having the first and the second magnetic layers coupled together magnetically antiparallel to each other via a nonmagnetic layer, and in which magnitudes of magnetization are different, and the magnetization of said first and the second magnetic layers is capable of magnetization reversal while maintaining the antiparallel state, and a ferromagnetic fixed layer tunnel-functioned with said free layer via an insulating layer, wherein: aid ferromagnetic fixed layer and said free layer are made to be a ferromagnetic spin tunnel junction. In addition to the structure described above, the spin injection part having an injection junction part bonded to a free layer and a spin polarization part may be provided. The injection junction part of a spin injection part may be either nonmagnetic conductive layer or nonmagnetic insulating layer. The spin polarization electrons may be capable of spin conservation conduction or tunnel junction at an injection junction part of a spin injection part. The spin polarization part of a spin injection part may also be a ferromagnetic layer. The spin polarization part of a spin injection part may be provided in contact with an antiferromagnetic layer that fixes the spin of a ferromagnetic layer. The aspect ratio of the first and the second magnetic layers of the free layer in contact with the injection junction part of said spin injection part may be less than 2. The injection junction part of a spin injection part may be word line. In such structure of a spin injection magnetic apparatus, if a spin is injected, the magnetization-reversal of the free layer is occurred. And the tunnel magnetoresistance effect appears due to the magnetization of the free layer becoming parallel or antiparallel with respect to the magnetization of the fixed layer. Therefore, the spin injection magnetic apparatus of the present invention can cause magnetic reversal of a free layer with lower current density by spin injection.

A spin injection device is characterized in that, in a spin injection device comprising a spin injection part having a spin polarization part including a ferromagnetic fixed layer and an injection junction part of a nonmagnetic layer, and a ferromagnetic free layer provided in contact with said spin injection part, wherein: said nonmagnetic layer is made of an insulator or a conductor, a nonmagnetic layer is provided on the surface of said ferromagnetic free layer, and an electric current flows in the direction perpendicular to the film surface of said spin injection device in order to reverse a magnetization of said ferromagnetic free layer. Here, the ferromagnetic free layer is of Co or Co alloy, the nonmagnetic layer on the surface of ferromagnetic free layer is Ru layer, and its film thickness is preferably 0.1-20 nm.

A spin injection device is characterized in that, in a spin injection device comprising a spin injection part having a spin polarization part including a ferromagnetic fixed layer and an injection junction part of a nonmagnetic layer, and a ferromagnetic free layer provided in contact with said spin injection part, wherein: said nonmagnetic layer is made of an insulator or a conductor, a nonmagnetic and a ferromagnetic layers are provided on the surface of said ferromagnetic free layer, and an electric current flows in the direction perpendicular to the film surface of said spin injection device in order to reverse a magnetization of said ferromagnetic free layer. Said ferromagnetic free layer and said ferromagnetic layer are of Co or Co alloy, a nonmagnetic layer on the surface of said ferromagnetic free layer is Ru layer, and its film thickness may be 2-20 nm. In such structure of a spin injection device, when a spin is injected from a spin polarization part via an injection junction part, the magnetization of the ferromagnetic free layer is reversed. Therefore, the spin injection device of the present invention can exhibit magnetic reversal with lower current density.

A spin injection magnetic apparatus uses a spin injection device. In such structure of the spin injection magnetic apparatus, when a spin is injected, the magnetization reversal of a ferromagnetic free layer is occurred. And either giant magnetoresistance effect or tunnel magnetoresistance effect appears due to the magnetization of the free layer becoming parallel or antiparallel with respect to the magnetization of the fixed layer. Therefore, the spin injection magnetic apparatus of the present invention can exhibit the magnetic reversal of the ferromagnetic free layer by spin injection with lower current density.

A spin injection magnetic memory device uses a spin injection device. In such structure of the spin injection magnetic memory device, when a spin is injected, the magnetization reversal of a ferromagnetic free layer is occurred, and either giant magnetoresistance effect or tunnel magnetoresistance effect appears due to the magnetization of the free layer becoming parallel or antiparallel with respect to the magnetization of the fixed layer. Therefore, the spin injection magnetic memory device of the present invention can offer a memory device owing to magnetic reversal of the ferromagnetic free layer by spin injection with lower current density.

The present inventors also discovered, as a result of forming $Co_2Fe_xCr_{1-x}Al$ ($0 \leq x \leq 1$) thin film, that said film is ferromagnetic at room temperature, and can be formed in either one of structures $L2_1$, B2, and A2 without heating a substrate, and thereby completed the present invention.

The object mentioned above is achieved with a magnetic thin film that comprises a substrate, and $Co2Fe_xCr_{1-x}Al$ thin film formed on said substrate, and said $Co_2Fe_xCr_{1-x}Al$ thin film has either of structures $L2_1$, B2, and A2, and in which x is $0 \leq x \leq 1$. In the aspect mentioned above, $Co_2Fe_xCr_{1-x}Al$ thin film can be formed without heating a substrate. Said substrate may be either one of thermally oxidized Si, glass, MgO single crystal, GaAs single crystal, or $Al_2O_3$ single crystal. The buffer layer may be provided between the substrate and $Co_2Fe_xCr_{1-x}Al$ thin film. As said buffer layer, at least one of Al, Cu, Cr, Fe, Nb, Ni, Ta, and NiFe may be used. According to this aspect, $Co_2Fe_xCr_{1-x}Al$ magnetic thin film (where $0 \leq x \leq 1$), which is a ferromagnet at room temperature and has high spin polarizability, can be obtained.

A tunnel magnetoresistance effect device is characterized in that it has a plurality of ferromagnetic layers on a substrate, at least one of the ferromagnetic layers is $Co_2Fe_xCr_{1-x}Al$ magnetic thin film (where $0 \leq x \leq 1$) having either one of structures $L2_1$, B2, and A2. Said ferromagnetic layer consists of a fixed and a free layers, and said free layer is preferably $Co_2Fe_xCr_{1-x}Al$ magnetic thin film (where $0 \leq x \leq 1$) having either one of structures $L2_1$, B2, and A2. $Co_2Fe_xCr_{1-x}Al$ thin film can be formed without heating a substrate. In this case, the substrate may be either one of thermally oxidized Si, glass, MgO single crystal, GaAs single crystal, or $Al_2O_3$ single crystal. The buffer layer may be provided between the substrate and $Co_2Fe_xCr_{1-x}Al$ thin film. Said buffer layer may be made up with at least one of Al, Cu, Cr, Fe, Nb, Ni, Ta, and NiFe. According to the aspect mentioned above, the tunnel magnetoresistance effect device with large TMR in low external magnetic field can be obtained at room temperature.

A giant magnetoresistance effect device is characterized in that it has a plurality of ferromagnetic layers on a substrate, at least one of the ferromagnetic layers consists of $CO_2Fe_xCr_{1-x}Al$ magnetic thin film (where $0 \leq x \leq 1$) having either one of structures $L2_1$, B2, and A2, and has the structure in which electric current flows in the direction perpendicular to film surface. Said ferromagnetic layer consists of a fixed and a free layers, and said free layer is preferably $Co_2Fe_xCr_{1-x}Al$ magnetic thin film (where $0 \leq x \leq 1$) having either one of structures $L2_1$, B2, and A2. Said $Co_2Fe_xCr_{1-x}Al$ thin film can be formed without heating a substrate. The buffer layer may be provided between the substrate and $Co_2Fe_xCr_{1-x}Al$ thin film. As the substrate, either one of thermally oxidized Si, glass, MgO single crystal, or $Al_2O_3$ single crystal may be used. Said buffer layer may be made up with at least one of Al, Cu, Cr, Fe, Nb, Ni, Ta, and NiFe. According to the aspect mentioned above, the giant magnetoresistance effect device with large GMR in low external magnetic field can be obtained at room temperature.

A magnetic device is characterized in that it is formed with $CO_2Fe_xCr_{1-x}Al$ magnetic thin film ($0 \leq x \leq 1$) having either of structures $L2_1$, B2, and A2 being formed on a substrate. In this case, the tunnel magnetoresistance effect device or the giant magnetoresistance effect device, of which a free layer is made of said $Co_2Fe_xCr_{1-x}Al$ magnetic thin film ($0 \leq x \leq 1$), may be used. The tunnel magnetoresistance effect device or the giant magnetoresistance effect device is preferably fabricated without heating a substrate. Also the tunnel magnetoresistance effect device or giant magnetoresistance effect device, which has a buffer layer provided between the substrate and $Co_2Fe_xCr_{1-x}Al$ thin film ($0 \leq x \leq 1$), may be used. The tunnel magnetoresistance effect device or the giant magnetoresistance effect device, in which said substrate is either one of thermally oxidized Si, glass, MgO single crystal, GaAs single crystal, or $Al_2O_3$ single crystal, may be used. The tunnel magnetoresistance effect device or the giant magnetoresistance effect device, in which at least one of Al, Cu, Cr, Fe, Nb, Ni, Ta, and NiFe is used as the buffer layer, may be used. According to the aspect mentioned above, the magnetic device that uses a magnetoresistance effect device with large TMR and GMR in low external magnetic field can be obtained at room temperature.

A magnetic head and a magnetic recording apparatus are characterized in that $Co_2Fe_xCr_{1-x}Al$ magnetic thin film (where $0 \leq x \leq 1$) having either of structures $L2_1$, B2, and A2 is formed on a substrate. According to the aspect mentioned above, said tunnel magnetoresistance effect device or giant magnetoresistance effect device, in which a free layer is said $CO_2Fe_xCr_{1-x}Al$ magnetic thin film (where $0 \leq x \leq 1$), is preferably used. Said tunnel magnetoresistance effect device or the giant magnetoresistance effect device, which is manufactured without heating a substrate, may also be used. Also the tunnel magnetoresistance effect device or the giant magnetoresistance effect device, which has a buffer layer provided between the substrate and $Co_2Fe_xCr_{1-x}Al$ thin film ($0 \leq x \leq 1$), may be used. The tunnel magnetoresistance effect device or the giant magnetoresistance effect device, in which a substrate is either one of thermally oxidized Si, glass, MgO single crystal, GaAs single crystal, or $Al_2O_3$ single crystal, may be used. Further, the tunnel magnetoresistance effect device or the giant magnetoresistance effect device, in which a buffer layer is made of at least one of Al, Cu, Cr, Fe, Nb, Ni, Ta, and NiFe, may be used. According to the aspect mentioned above, the magnetic head and the magnetic recording apparatus of large capacity and high speed can be obtained by using a magnetoresistance effect device with large TMR and GMR in low external magnetic field at room temperature.

BRIEF DESCRIPTION OF THE DRAWINGS

The present invention will better be understood from the following detailed description and the drawings attached hereto showing certain illustrative forms of implementation of the present invention. In this connection, it should be noted that such forms of implementation illustrated in the accompanying drawings hereof are intended in no way to specify or limit the present invention but to facilitate an explanation and understanding thereof. In the drawings.

BEST MODES FOR CARRYING OUT THE INVENTION

Hereinafter, forms of implementations of the present invention will be described in detail with reference to the accompanying drawings. In each figure, identical marks and symbols are used for identical or corresponding parts.

Figure 1:
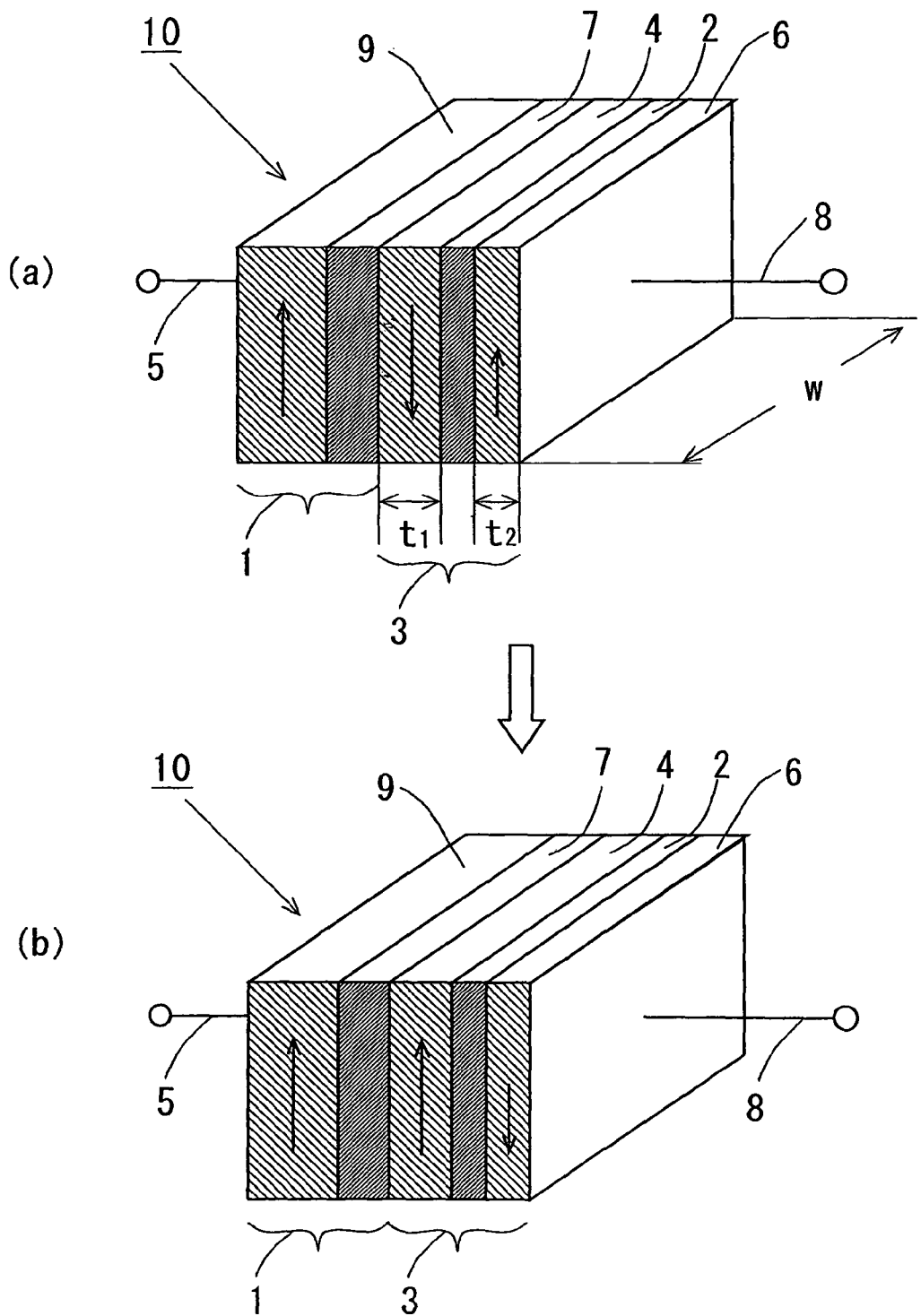
FIG. 1 is a diagrammatic view illustrating a spin injection device according to the first implementation of the present invention; (a) is a view illustrating a spin of SyAF in downward state, and (b) is a view illustrating a spin of SyAF in upward state by spin injection.

FIG. 1 is a diagrammatic view illustrating a spin injection device of the present invention; (a) is a view illustrating a spin of SyAF in downward state, and (b) is a view illustrating a spin of SyAF in upward state by spin injection. As shown in FIG. 1, the spin injection device 10 of the present invention is provided with a spin injection part 1 having a spin polarization part 9 and an injection junction part 7, and SyAF 3 in which the first magnetic layer 4 and the second magnetic layer 6 form a triple layer structure via an antiferromagnetically connected nonmagnetic layer 2, and these form a laminated structure.

SyAF 3 according to the present invention is explained first. The magnetic field Hsw required for a ferromagnet for magnetization reversal in single layer film is given in general as the Equation (2), using monoaxis magnetic anisotropy Ku, saturated magnetization Ms, film thickness t, and width w, $$Hsw = 2Ku/Ms + C(k)tMs/w \quad (2),$$

where the first term is derived from the magnetic anisotropy and the second term is derived from the antimagnetic field, respectively.

On the other hand, similarly in case of a single magnetic segment structure, the magnetization reversal magnetic field of SyAF having the film thicknesses $t_1$ and $t_2$ of two ferromagnetic layers, and the saturated magnetization $M_1$ and $M_2$ is given as Equation (3).

$$Hsw = 2Ku/\Delta M + C(k)(t_1+t_2)\Delta M/w \quad (3),$$

where $\Delta M = (t_1+t_2)/(M_1 t_1 - M_2 t_2)$, and w is the width of SyAF.

In the above-mentioned Equations (2) and (3), C(k) is the antiferromagnetic coefficient depending upon aspect ratio k, and is smaller as k approaches 1, resulting in C(k)=0 at k=1. Here, aspect ratio k is t/w. Therefore, it is $t_1$/w in case of the first magnetic layer 4, and $t_2$/w in case of the second magnetic layer 6 (Refer to FIG. 1(a)).

In case of a small device, since the second term is larger than the first term, in general, in both Equations (2) and (3), and since $\Delta M < Ms$, the magnetization reversal magnetic field for SyAF is smaller for the same w. On the other hand, since C(k) is 0 for k=1, the magnetization reversal magnetic field is determined by the first term of Equations (2) and (3), that is, magnetic anisotropy, and does not depend upon the device size. However, in case of single layer film, it takes multimagnetic segment structure for k at least 2 or less, so that the magnetization reversal magnetic field is not given by the Equation (2), and its value becomes larger, and depends upon the device size. Therefore, in case of single layer film, the device of k≦2 is not realistic.

However, the present inventors discovered that, in case of SyAF of the present invention, it takes a single magnetic segment structure even for k≦2, especially for k≦1. As a result, SyAF of the present invention can take smaller magnetic field for the magnetization reversal. And especially, the magnetic field for the magnetization reversal does not depend upon the device size for the device of k=1. The present invention is based on this discovery, and, by injecting spin polarization electrons into SyAF, the magnetization reversal can be realized at lower current density. Especially, since C(k) is zero for k=1, the magnetization reversal field becomes remarkably small.

Such SyAF 3 of the present invention has a triple layer structure, as shown in FIGS. 1(a) and (b), in which two magnetic layers of the first and the second magnetic layers 4 and 6, respectively, are magnetically coupled antiparallel to each other via a nonmagnetic layer 2, and are formed with respective film thicknesses are in nanometer size. The magnetization reversal of SyAF 3 is realized by spin injection from the spin polarization part 9 of a ferromagnetic layer into said SyAF 3 via the injection junction part 7 of a nonmagnetic metal layer of the spin injection part 1.

Figure 5:
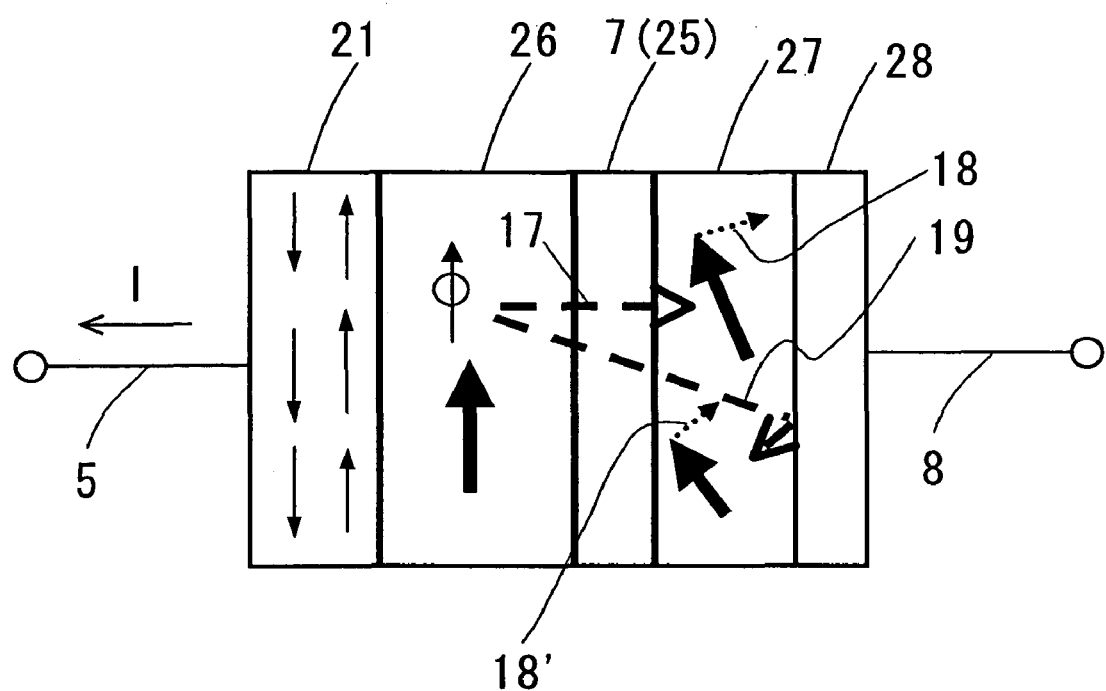
FIG. 5 is a diagrammatic view illustrating magnetization reversal of a spin injection device according to the third implementation.
Figure 8:
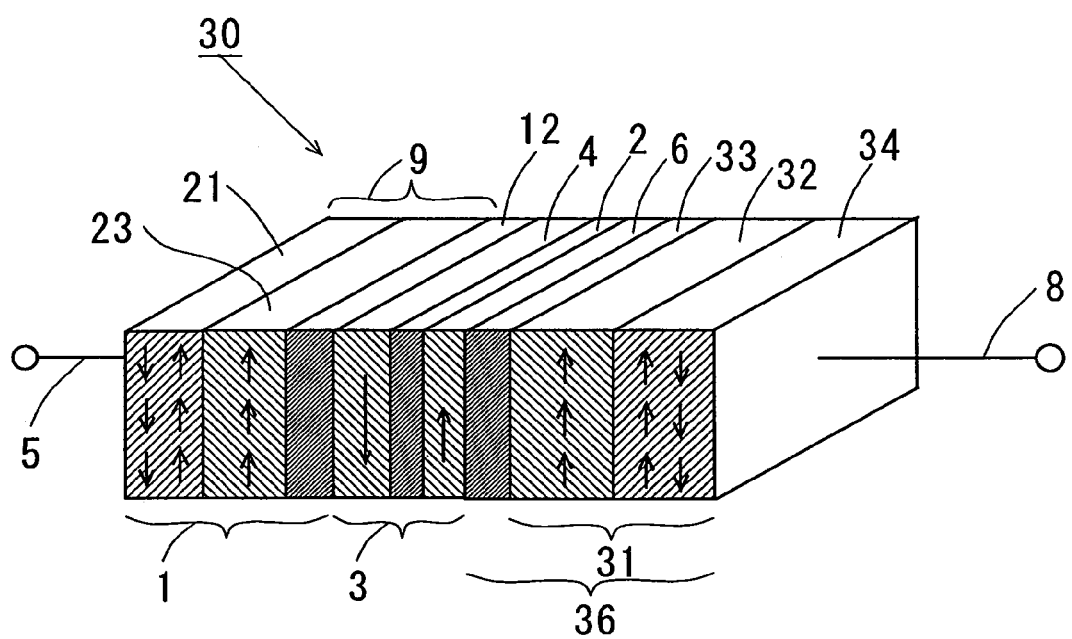
FIG. 8 is a diagrammatic view illustrating a spin injection magnetic apparatus according to the present invention.

The nonmagnetic layer 2 is the material to antimagnetically connect the magnetization of both magnetic layers via the nonmagnetic layer 2, and as this antinonferromagnetic layer, Ruthenium (Ru), Iridium (Ir), and Rhodium (Rh) can be utilized. Here, in FIG. 1(a), 5 and 8 show the terminals to flow electric current. Since the ferromagnetic and the magnetic layers are conductive, they can be used also as electrodes, but electrodes may be inserted separately to flow electric current.

As shown in FIG. 1(b), in SyAF 3 of the present invention, the spins of the first and the second magnetic layers 4 and 6 are magnetically coupled while maintained in antiparallel state. That is, the magnetizations of the first and the second magnetic layers 4 and 6 are those in antiparallel state of different sizes, in other words, they have antiparallel spins of different sizes. Assuming the thickness of the first magnetic layer 4 as $t_1$, the magnetization as $M_1$, the thickness of the second magnetic layer 6 as $t_2$, the magnetization as $M_2$, the direction of the larger magnetization ($t_1 M_1 - t_2 M_2$) can be the direction of the spin of SyAF ↑ or ↓ with regard to the arrow indicating the spin of a ferromagnetic layer 9 in FIG. 1. In order to make difference in the magnitude of antiparallel magnetizations of the magnetic layers 4 and 6 of SyAF 3, $t_1 M_1$ and $t_2 M_2$ may be made different.

Figure 2:
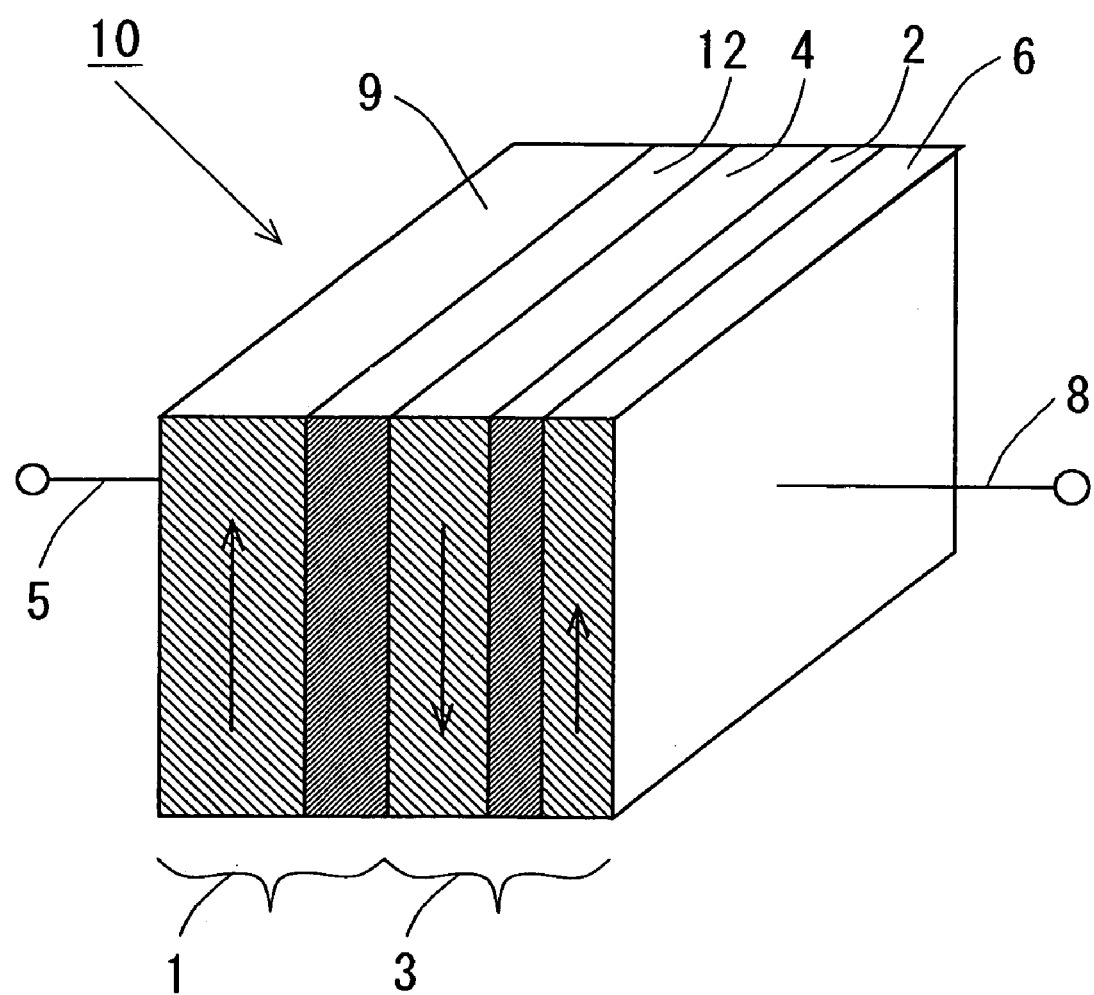
FIG. 2 is a diagrammatic view illustrating a spin injection device according to the first implementation in which the spin junction part is a nonmagnetic insulating layer.

The spin injection part 1 has the layered structure made of the spin polarization part 9 consisting of a ferromagnetic layer and an injection junction part 7 consisting of a nonmagnetic conductive layer, and the injection junction part 7 of a nonmagnetic conductive layer has a nanometer size. Here, the nanometer size means the size capable of conduction while an electron conserves its momentum and spin. That is, said injection junction part 7 has the size capable of spin conservation conduction. In case that the injection junction part 7 is metallic, the mean free path of an electron is 1 μm or less, and in the device of the size of 1 μm or less, the injected spin can flow into the other without relaxation. The injection junction part 7 of the spin injection part 1 may be a nonmagnetic insulating layer 12, as shown in FIG. 2. Said nonmagnetic insulating layer 12 has a nanometer size, namely several nm, capable of tunnel junction which allows tunnel current.

Although the spin polarization part 9 made of a ferromagnetic layer is a ferromagnet, the numbers of upspin and downspin electrons on conductive Fermi surface differ, and the spin-polarized electrons flow from said spin polarization part 9 made of a ferromagnetic layer into the injection junction part 7 of a nonmagnetic metal layer.

In such the spin injection device according to the present invention, when such very low electric current as 1 milliampere (mA) or lower flows, and a spin is injected from the spin polarization part 9 of a ferromagnetic layer in the direction perpendicular to film surface via the injection junction part 7 of the nonmagnetic metal layer (or of the nonmagnetic insulating layer 12), the spins of the magnetic layers 4 and 6 of SyAF 3 are reversely magnetized while preserving antiparallel state. Therefore, the spin injection device of the present invention is capable of magnetization reversal by spin injection at lower current density. Thereby, since the spin injection magnetization reversal is possible only by flowing small electric current without applying magnetic field using current flow, the spin injection device provided with logic, memory, and storage can be realized.

The second implementation is explained next.

Figure 3:
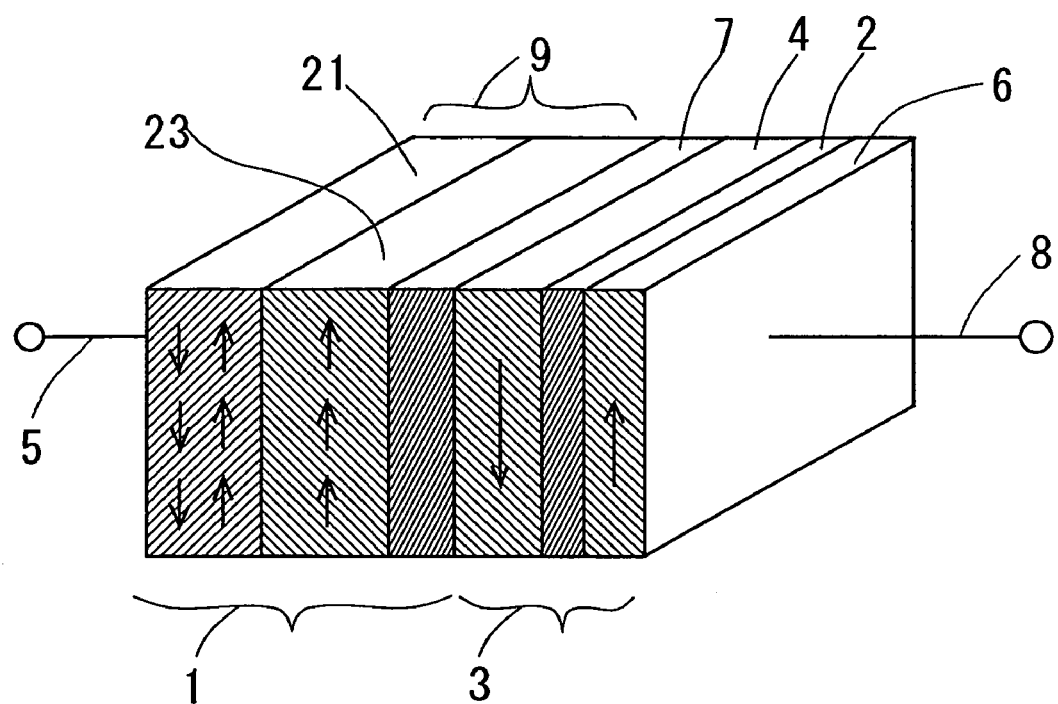
FIG. 3 is a diagrammatic view illustrating a spin injection device according to the second implementation of the present invention.

FIG. 3 is a diagrammatic view illustrating a spin injection device according to the second implementation of the present invention. Referring to FIG. 3, those by this implementation have the structure in which a spin polarization part 9 has an antiferromagnetic layer 21 and a ferromagnetic layer 23, and fix the spin of the ferromagnetic layer 23 by providing the antiferromagnetic layer 21 adjacent to the ferromagnetic layer 23. Also, the injection junction part is a nonmagnetic metal layer 25 capable of spin conservation conduction, but instead an insulating layer capable of tunnel junction may be used. In such structure, spins are injected by fixing the spin of a spin polarization part, thereby the magnetization reversal of SyAF is possible.

Figure 4:
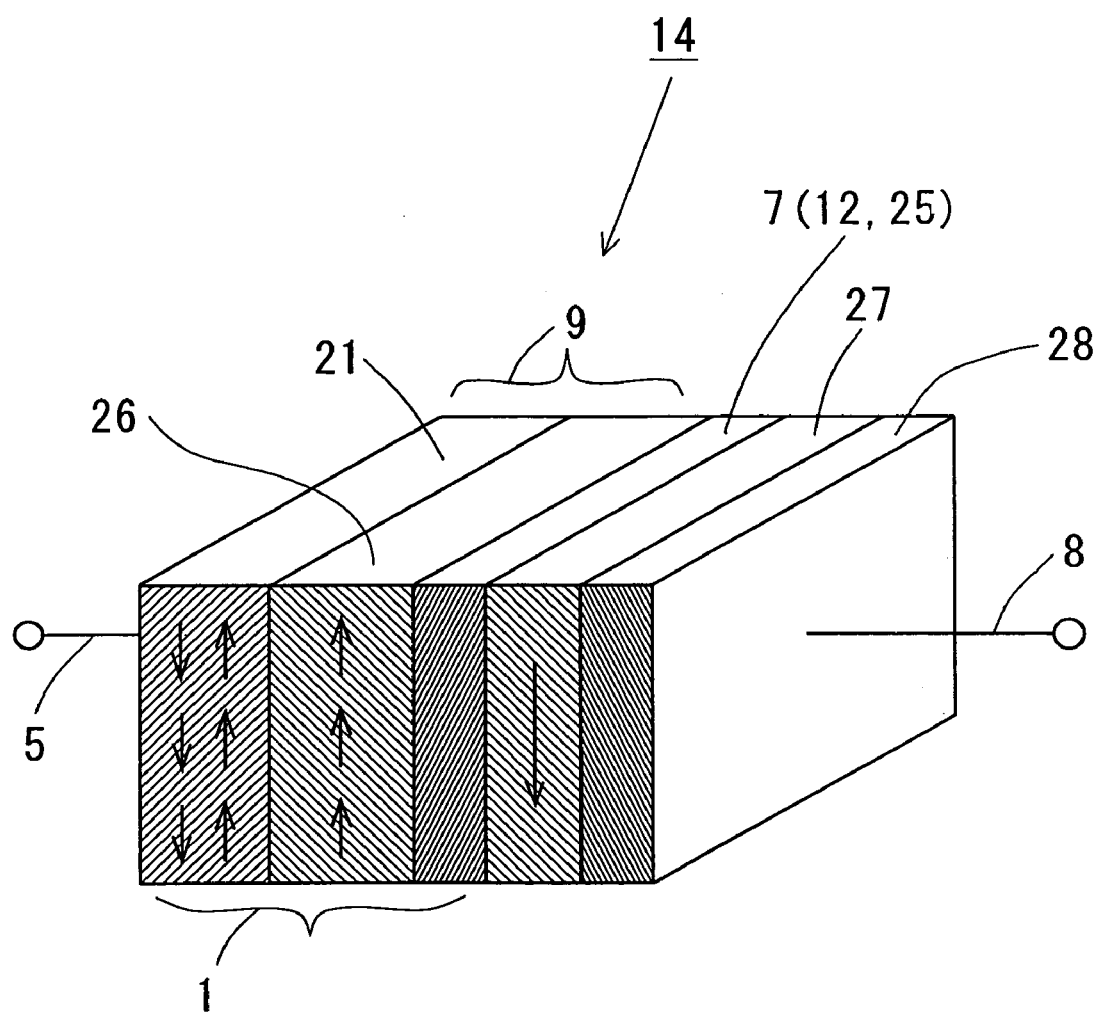
FIG. 4 is a diagrammatic view illustrating a spin injection device according to the third implementation of the present invention.

The third implementation is explained next. FIG. 4 is a diagrammatic view illustrating a spin injection device according to the third implementation. Referring to FIG. 4, this spin injection device 14 comprises a spin polarization part 9 consisting of an antiferromagnetic layer 21 and a ferromagnetic fixed layer 26, a nonmagnetic layer 7 made of an injection junction part provided in contact with the ferromagnetic fixed layer, and a double layer structure made of a ferromagnetic free layer 27 and a nonmagnetic layer 28 onto the nonmagnetic layer 7.

The spin injection part 1 consists of the spin polarization part 9 and the injection junction part 7, and, in the spin polarization part 9, the spin of the ferromagnetic fixed layer 26 is fixed by providing the antiferromagnetic layer 21 adjacent to the ferromagnetic fixed layer 26. The injection junction part 7 is a nonmagnetic metal layer 25 of Cu or others capable of spin conservation conduction, but instead an insulating layer 12 capable of tunnel junction may be used.

The difference of the spin injection device 14 of the third implementation from that shown in FIG. 3 is that it is provided with a ferromagnetic free layer 27 and a nonmagnetic layer 28 instead of SyAF 3. The nonmagnetic layer 28 is provided to reflect the majority spins at the interface with the ferromagnetic free layer 27, and to transmit the minority spins. Therefore, the film thickness of the nonmagnetic layer 28 may be chosen within the distance where the minority spin can move with the spin conserved, that is, spin diffusion length.

Here, Co or Co alloy may be used as the ferromagnetic free layer 27. As the nonmagnetic layer 28, Ru, Ir, and Rh are applicable, and especially Ru is preferably used. Also, the spin diffusion length of Ru is known as 14 nm, so that the film thickness of Ru may be 0.1-20 nm. Hereinafter, the explanation will be made with Co or Co alloy as the ferromagnetic free layer 27, and Ru as the nonmagnetic layer 28.

FIG. 5 is a diagrammatic view illustrating magnetization reversal of a spin injection device 14 according to said third implementation. In FIG. 5, when electrons are injected from a ferromagnetic fixed layer 26 to a ferromagnetic free layer 27, the torque 18 is given by majority spin electrons 17 so that the magnetization of the ferromagnetic free layer 27 is aligned to that of the ferromagnetic fixed layer 26. In this case, it is known that, at the interface between Co or Co alloy 27 and Ru 28, majority spin electrons are strongly scattered (reflected), and minority spin electrons are little dispersed (transmitted). Therefore, as is shown in FIG. 5, the majority spin electrons 19 reflected at the interface between Co or Co alloy 27 and Ru 28 also give similar torque 18' to the ferromagnetic free layer 27, if the thickness of Co or Co alloy 27 is so thin that spin conduction is conserved. Thereby, the torque of the ferromagnetic free layer 27 practically increases, and is aligned in the same direction as magnetization of the ferromagnetic fixed layer 26. On the other hand, when the current direction is reversed, and electrons are injected from Ru layer 28 to Co or Co alloy 27 side, majority spin electrons are reflected at the interface between Co or Co alloy 27 and Ru 28, only minority spin electrons are injected into the ferromagnetic free layer 27 made of Co or Co alloy, said minority spin electrons give torque to the spin of the ferromagnetic free layer 27, and try to align said spin in one direction, namely, downward. Thereby, the torque by minority spin electrons of the ferromagnetic free layer 27 increases, and the spin of the ferromagnetic free layer 27 is aligned antiparallel with respect to magnetization of the ferromagnetic fixed layer 26. Thus, by the spin injection device 14 of the present invention with insertion of the nonmagnetic layer 28, spin of a spin polarization part 9 is fixed and spins are injected so that the magnetization reversal of the ferromagnetic free layer 27 can be realized at lower current density than that of a conventional spin injection magnetization reversal.

Figure 6:
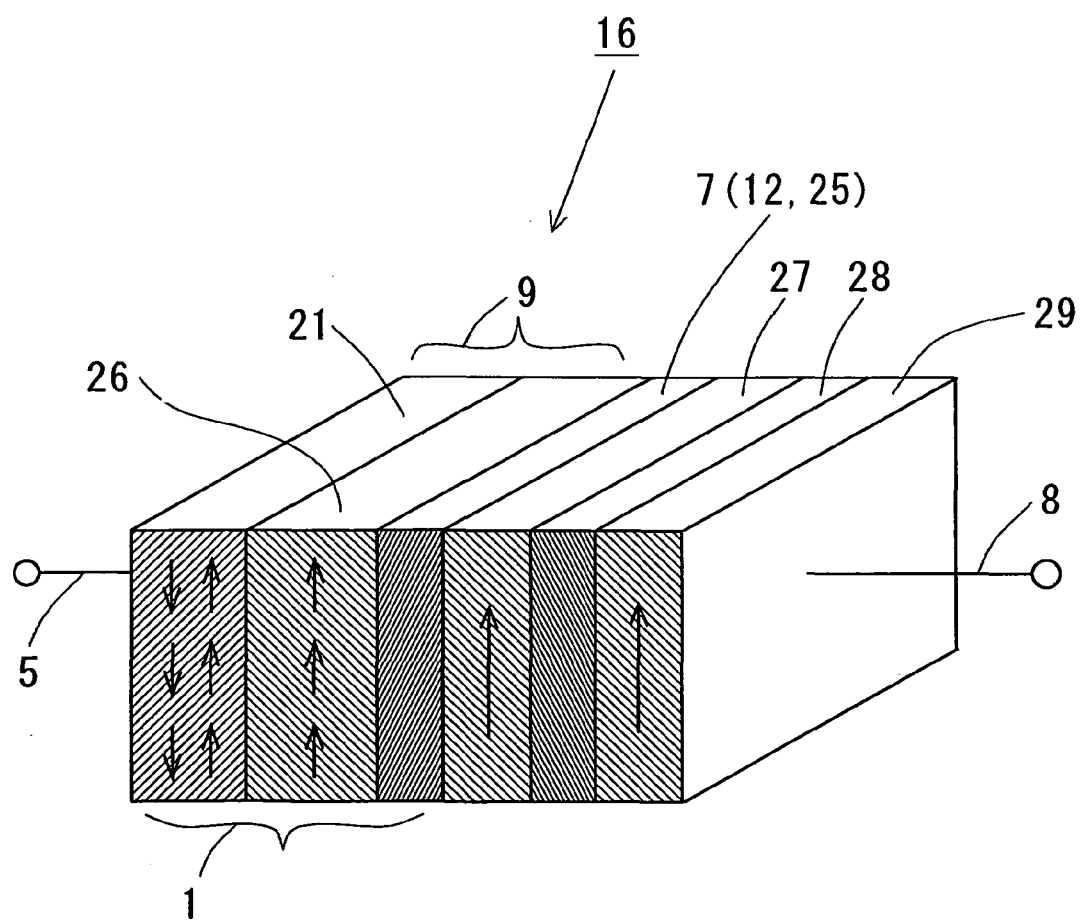
FIG. 6 is a diagrammatic view illustrating a spin injection device according to the fourth implementation of the present invention.

Further, a spin injection device of the fourth implementation is explained with reference to FIG. 6. The difference of a spin injection device 16 of this implementation from that of the spin injection device 14 as shown in FIG. 4 is that a ferromagnetic fixed layer 29 is provided in addition onto a nonmagnetic layer 28. Other aspect is omitted because it is identical with the spin injection device 14 as shown in FIG. 4. Here, the thickness of the nonmagnetic layer 28 may be determined so that the ferromagnetic free layer 27 and the ferromagnetic fixed layer 29 do not have antiparallel magnetization as in case of SyAF 3, and that spin conservation conduction is occurred. Therefore, in case that Co or Co alloy as the ferromagnetic free layer 27 and the ferromagnetic fixed layer 29 and Ru as the nonmagnetic layer 28 are used, the thickness of Ru may be about 2-20 nm so not to be SyAF 3.

Next, the operation of the spin injection device 16 of the fourth implementation is explained. In FIG. 6, when electrons are injected from the ferromagnetic fixed layer 26 to the ferromagnetic free layer 27, like the spin injection device 14 of said third implementation, magnetization of the ferromagnetic free layer 27 made of Co or Co alloy is aligned in the same direction as magnetization of the ferromagnetic fixed layer 26.

Figure 7:
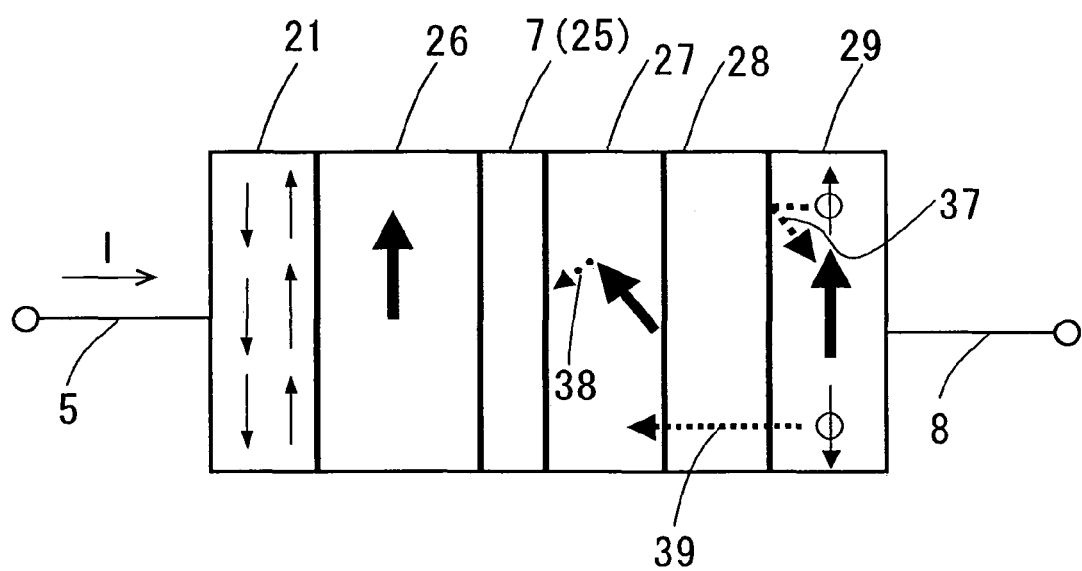
FIG. 7 is a diagrammatic view illustrating magnetization reversal of a spin injection device according to the fourth implementation.

On the other hand, the case of reverse current direction is explained with reference to FIG. 7. FIG. 7 is a diagrammatic view illustrating magnetization reversal of the spin injection device 16 according to the fourth implementation. When electrons are injected from the ferromagnetic fixed layer 29 to the ferromagnetic free layer 27, majority spin electrons 37 are strongly reflected at the interface between the ferromagnetic fixed layer 29 and Ru layer 28, and do not reach to the ferromagnetic free layer 27. In this case, if the film thickness of Co or Co alloy 27 is so thin that spin conduction is conserved, minority spin electrons 39, since not scattered, reach to the ferromagnetic free layer 27, and give torque 38 so the spin of the ferromagnetic free layer 27 is aligned. Therefore, the magnetization of the ferromagnetic free layer 27 becomes antiparallel with respect to the ferromagnetic fixed layer 26. Thereby, compared with the case lacking Ru layer 28, majority spin electrons 37 do not reach to the ferromagnetic free layer 27, and are capable of magnetization reversal at lower current density.

Thus, by the spin injection device 16 of said implementation, the spin of a spin polarization part 9 is fixed and spins are injected. And the magnetization reversal of the ferromagnetic free layer 27 is possible at lower current density in a ferromagnetic free layer 27, a nonmagnetic layer 28, and a ferromagnetic fixed layer 29 used instead of SyAF 3.

In said spin injection device, since the magnetization of the ferromagnetic free layer 27 becomes parallel or antiparallel with respect to that of a ferromagnetic fixed layer 26 when the magnetization reversal occurs, the layered structure, which includes the antiferromagnetic layer 21, the ferromagnetic fixed layer 26, the injection junction part made of the nonmagnetic metal layer 25 of Cu or others, and a ferromagnetic free layer 27, exhibits a giant magnetoresistance effect like a giant magnetoresistance effect device of CPP type.

Also in case that the nonmagnetic layer 7 is an insulating layer 12 capable of tunnel junction, when the magnetization reversal of a ferromagnetic free layer 27 occurs, the layered structure, which includes an antiferromagnetic layer 21, a ferromagnetic fixed layer 26, an insulating layer 12 capable of tunnel junction, and a ferromagnetic free layer 27, exhibits the tunnel magnetoresistance effect like a tunnel magnetoresistance effect device of CPP type.

A spin injection magnetic apparatus of the present invention is explained next. FIG. 8 is a diagrammatic view illustrating a spin injection magnetic apparatus according to the present invention. The spin injection magnetic apparatus 30 is such that SyAF 3 as a free layer and a fixed layer 31 consisting of a ferromagnetic layer 32 and an antiferromagnetic layer 34 are a ferromagnetic spin tunnel junction (MTJ) device 36 tunnel-connected onto the insulating layer 33, and said MTJ device 36 is provided with a spin injection part 1 for magnetization reversal of the free layer as the ferromagnetic layer. The spin injection part 1 is such that the injection junction part is an insulating layer 12 capable of tunnel junction.

In such spin injection magnetic apparatus, when the spin is injected from a ferromagnetic layer 23 to SyAF 3 via the insulating layer 12, the magnetization of said SYAF 3 is reversed. By magnetization of a free layer as said SyAF 3 reversed to ↑ or ↓, and made parallel or antiparallel with respect to the magnetization of a fixed layer 31, the tunnel magnetoresistance (TMR) effect occurs. Thereby, said spin injection magnetic apparatus 30 can exhibit the magnetization reversal of the free layer by spin injection at lower current density.

In said spin injection magnetic apparatus, SyAF 3 may be replaced to have a double layer structure of the spin injection device 14 shown as the third implementation in FIG. 4 made of a ferromagnetic free layer 27 and a nonmagnetic layer 28 provided onto the ferromagnetic free layer. Also in said spin injection magnetic apparatus, SyAF 3 may be made to have a triple layer structure of the spin injection device 16 as shown the fourth implementation in FIG. 6 made of a ferromagnetic free layer 27, a nonmagnetic layer 28, and a ferromagnetic layer 29 provided onto the nonferromagnetic layer.

Thus, the spin injection magnetic apparatus of the present invention can be applied to ultragigabit large capacity, high speed, non-volatile memories. Such spin injection magnetic apparatus can be made a basic structure of MRAM and a spin injection magnetic memory devices by sandwiching or covering SyAF of a free layer with an insulating film capable of tunnel junction, connecting and microfabricating as word line at a spin injection part of the part corresponding to said SyAF, and by connecting bit line to the ferromagnetic layer of the fixed layer side and microfabrication. Here, besides SyAF, the free layer may use a double layer structure made of a ferromagnetic free layer 27 and a nonmagnetic layer 28, or a triple layer structure made of a ferromagnetic free layer 27, a nonmagnetic layer 28, and a ferromagnetic layer 29 provided on the nonferromagnetic layer.

Figure 9:
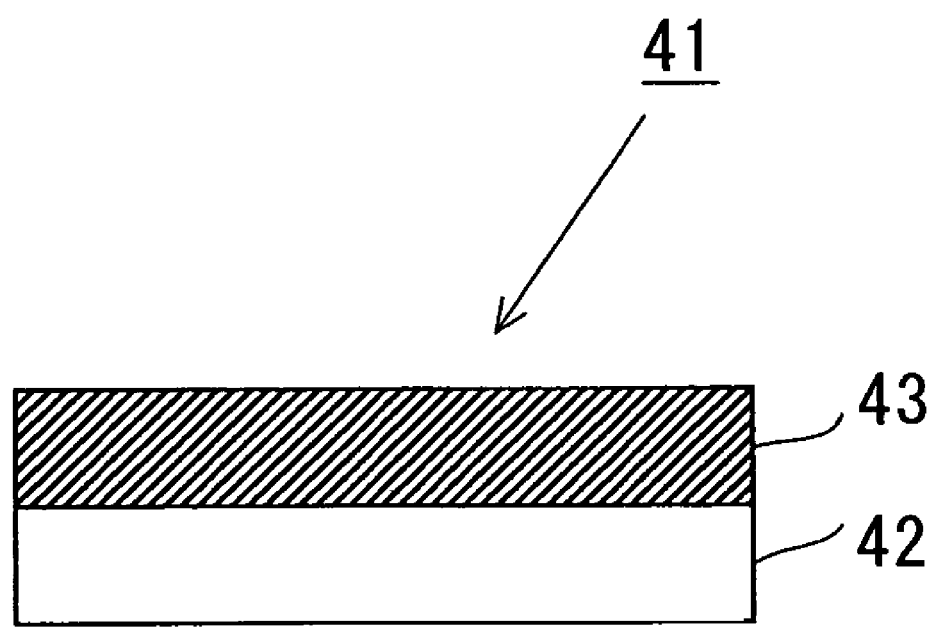
FIG. 9 is a cross-sectional view illustrating magnetic thin film that can be used for the present invention.

Next, a magnetic thin film of the present invention used for a spin injection device and a spin injection magnetic apparatus will be explained. FIG. 9 is a cross-sectional view illustrating magnetic thin film that can be used for the present invention. As shown in FIG. 9, magnetic thin film 41 is $Co_2Fe_xCr_{1-x}Al$ thin film 43, where $0 \leq x \leq 1$, provided at room temperature on a substrate 42. $CO_2Fe_xCr_{1-x}Al$ thin film 43 is ferromagnetic at room temperature, has the electrical resistivity of about 190 μΩcm, and has either one of $L2_1$, B2, or A2 structure without heating a substrate. By heating the substrate provided with said $CO_2Fe_xCr_{1-x}Al$ thin film 43, the $CO_2Fe_xCr_{1-x}Al$ thin film 43 of $L2_1$ structure with high spin polarizability can be obtained. Here, the film thickness of $Co_2Fe_xCr_{1-x}Al$ thin film 43 on the substrate 42 may be 1 nm or more and 1 μm or less.

Figure 10:
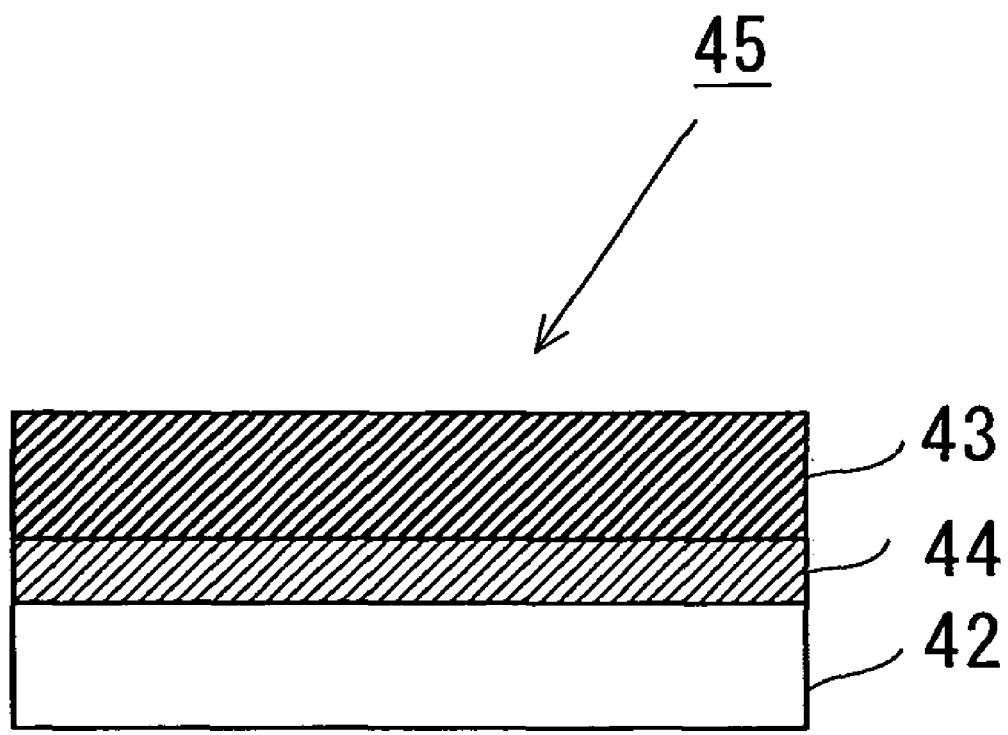
FIG. 10 is a cross-sectional view illustrating a modified version of magnetic thin film that can be used for the present invention.

FIG. 10 is a cross-sectional view illustrating a modified version of magnetic thin film that can be used for the present invention. The magnetic thin film 45 used for the present invention has additionally a buffer layer 44 inserted between the substrate 42 and $CO_2Cr_{1-x}Al$ (where $0 \leq x \leq 1$) thin film 43 in the structure of the magnetic thin film 41 of FIG. 9. By inserting a buffer layer 44, the crystal quality of $CO_2Fe_xCr_{1-x}Al$ (where $0 \leq x \leq 1$) thin film 43 on the substrate 42 can be further improved.

The substrate 42 used for said magnetic thin films 41 and 45 may be a thermally oxidized Si, a polycrystal of glass, or others, or a single crystal of MgO, $Al_2O_3$, or GaAs. As the buffer layer 44, Al, Cu, Cr, Fe, Nb, Ni, Ta, or NiFe may be used. The film thickness of said $CO_2Fe_xCr_{1-x}Al$ (where $0 \leq x \leq 1$) thin film 43 may be 1 nm or more and 1 μm or less. With said film thickness less than 1 nm, it is practically difficult to obtain any one of $L2_1$, B2, or A2 structure, as described below. And with said film thickness over 1 μm, application as a spin injection device becomes difficult, and these conditions are not preferred.

Figure 11:
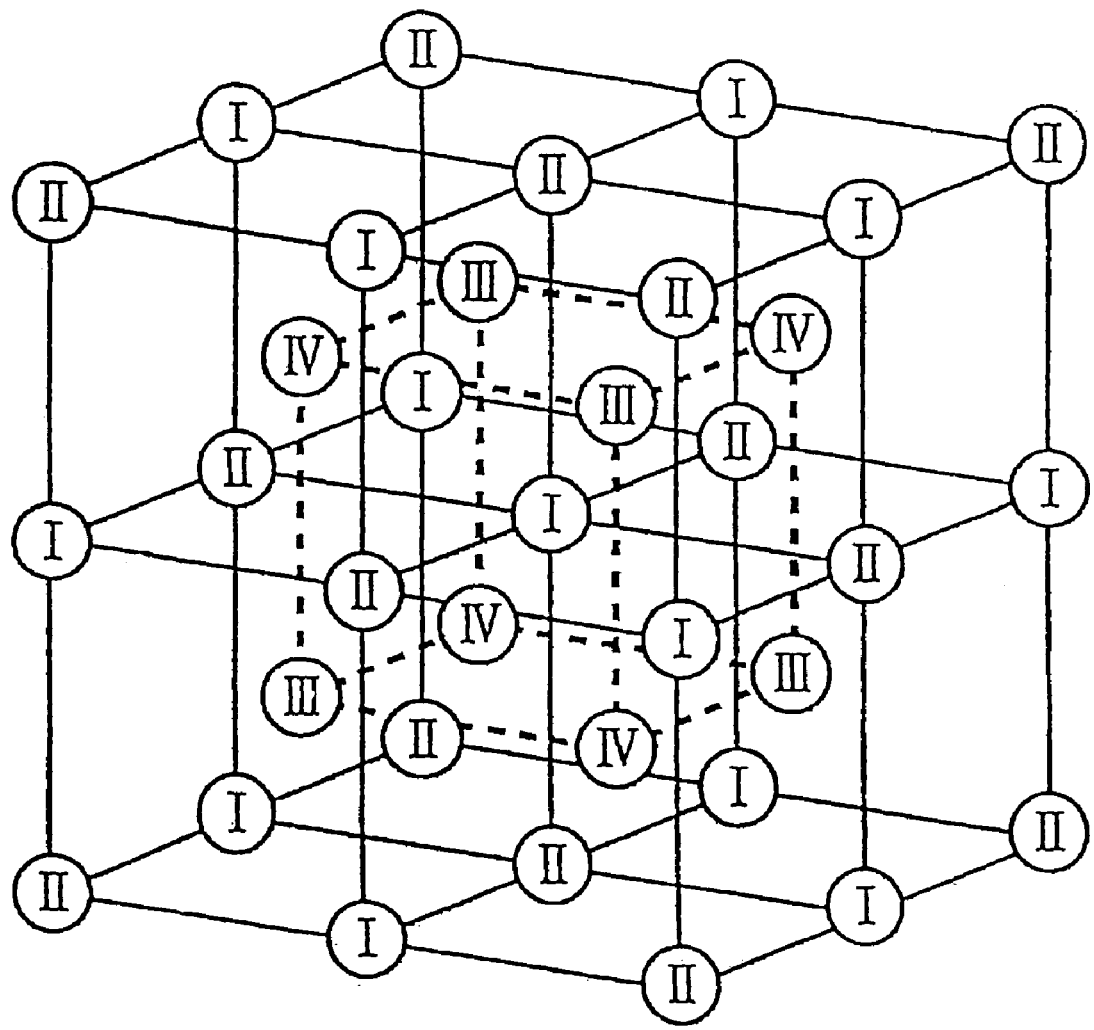
FIG. 11 is a view diagrammatically illustrating the structure of $Co_2Fe_xCr_{1-x}Al$ ($0 \leq x \leq 1$) used as a magnetic thin film.

The function of the magnetic thin film of said structure is explained next. FIG. 11 is a view diagrammatically illustrating the structure of $CO_2Fe_xCr_{1-x}Al$ ($0 \leq x \leq 1$) used as magnetic thin film. The structure in the figure illustrates that eight times as large (twice by a lattice constant) as a common unit lattice of bcc (body-centered cubic lattice). In the $L2_1$ structure of $Co_2Fe_xCr_{1-x}Al$, Fe and Cr are provided at the position I of FIG. 11 with composition ratio $Fe_xCr_{1-x}$ (where $0 \leq x \leq 1$), Al at the position II, and Co at positions III and IV. In the B2 structure of $CO_2Fe_xCr_{1-x}Al$, it is the structure in which Fe, Cr, and Al are irregularly arranged at positions I and II as shown in FIG. 11. In this case, they are arranged so the composition ratio of Fe and Cr is $Fe_xCr_{1-x}$ (where $0 \leq x \leq 1$). Further, in the A2 structure of $Co_2Fe_xCr_{1-x}Al$, it is the structure in which Co, Fe, Cr, and Al are irregularly substituted. In this case, they are arranged so the composition ratio of Fe and Cr is $Fe_xCr_{1-x}$ (where $0 \leq x \leq 1$).

Next, the magnetic property of magnetic thin films 41 and 45 of the structure mentioned above will be explained. $CO_2Fe_xCr_{1-x}Al$ (where $0 \leq x \leq 1$) thin film 43 having structure mentioned above can take either one of $L2_1$, B2, or A2 structure, even with a very thin film of film thickness about several nm.

Here, B2 structure of $CO_2Fe_xCr_{1-x}Al$ thin film (where $0 \leq x \leq 1$) is a specific material so far not obtained. B2 structure is similar to $L2_1$ structure, but the difference is that, in $L2_1$ structure, Cr (Fe) and Al atoms are regularly arranged, while they are irregularly arranged in B2 structure. Also, A2 structure is that in which Co, Fe, Cr, and Al are irregularly substituted. These differences can be measured by X-ray diffraction.

In the composition x of said $CO_2Fe_xCr_{1-x}Al$ thin film 43, in the range of $0 \leq x \leq 0.8$, either one of $L2_1$ or B2 structure can be obtained without specially heating a substrate. In $0.8 \leq x \leq 1$, A2 structure can be obtained. Also in the range of $0 \leq x \leq 1$ in composition x, $L2_1$ or B2 structure can be obtained by film forming of $Co_2Fe_xCr_{1-x}Al$ thin film on the heated substrate, or by thermal treatment after film forming without heating the substrate.

Although it is difficult to prove experimentally the magnetic thin films 41 and 45 of said structure to be a half metal, in a qualitative sense, by making a tunnel magnetoresistance effect device having tunnel junction, and if it shows very large TMR over 100%, then it may be regarded as half metal. As the result of making a tunnel magnetoresistance effect device using $Co_2Fe_xCr_{1-x}Al$ ($0 \leq x \leq 1$) thin film 43 as a ferromagnetic layer on one side of an insulating film, and the CoFe alloy of spin polarizability 0.5 as the other ferromagnetic layer of a insulating layer, large TMR over 100% was attained. Considering from the Equation (1), $CO_2Fe_xCr_{1-x}Al$ ($0 \leq x \leq 1$) thin film 43 is shown to have spin polarizability of P=0.7 or higher. In addition to $CO_2Fe_xCr_{1-x}Al$ ($0 \leq x \leq 1$) thin film 43 having high spin polarizability, the reason why such large TMR was attained is the discovery that either one of $L2_1$, B2, or A2 structure can be obtained at room temperature.

Accordingly, with magnetic thin films 41 and 45, ferromagnetic characteristics can be attained by thickness 1 nm or thicker of $Co_2Fe_xCr_{1-x}Al$ ($0 \leq x \leq 1$) thin film 43 without necessity of the substrate heating. It is considered from this that the large spin polarizability and large TMR in a tunnel magnetoresistance effect device can be obtained, since the surface is not oxidized, or the surface roughness does not increase, and since the interface of tunnel junction could be made clean and sharp.

Said magnetic thin films 41 and 45 can be used as the first and the second magnetic layers of SyAF 3 used for a spin injection device of the present invention, or for a ferromagnetic layer 9 of a spin injection part. The magnetic thin films 41 and 45 can also be used for a CPP type giant magnetoresistance effect device structure as the layered structure consisting of an antiferromagnetic 21, a ferromagnetic fixed layer 26, a nonmagnetic metal layer 25 such as Cu and others, and a ferromagnetic free layer 28, or for a tunnel magnetoresistance effect device structure as the layered structure consisting of an antiferromagnetic 21, an insulating layer 12 capable of tunnel junction with a ferromagnetic fixed layer 26, and a ferromagnetic free layer 27, which are used for a spin injection device 14 and 16 of the present invention. Further, it can be used for a ferromagnetic layer of an MTJ device or a tunnel magnetoresistance effect device used for a spin injection magnetic apparatus of the present invention.

Figure 12:
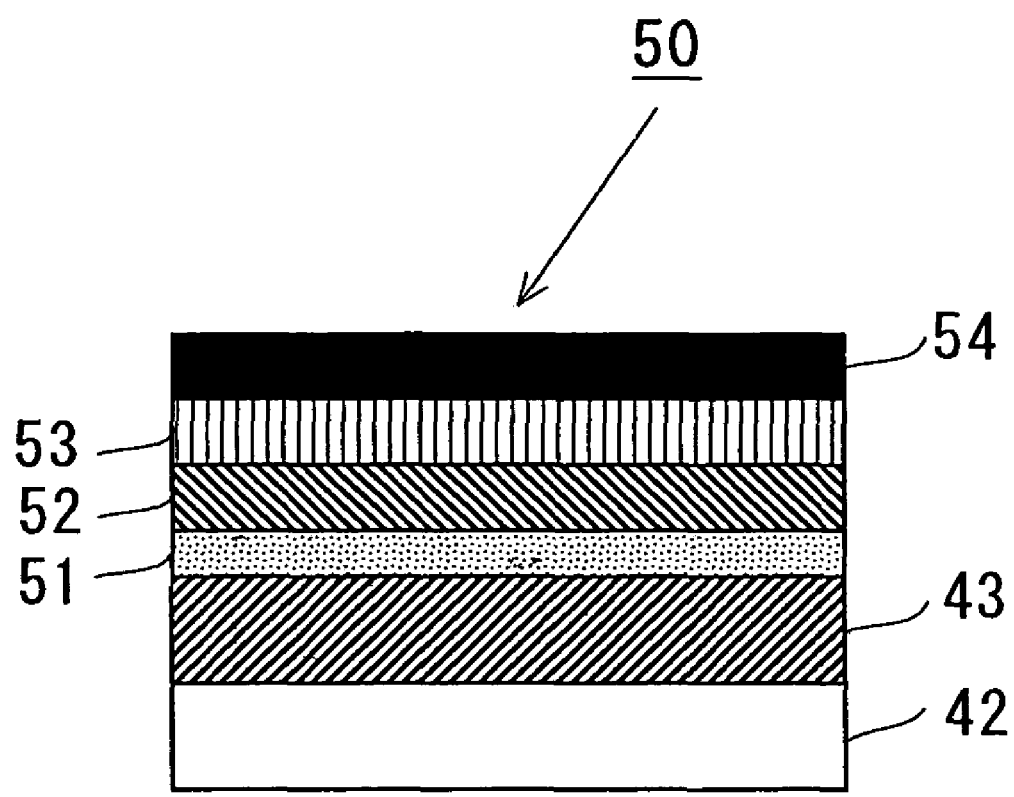
FIG. 12 is a view illustrating the cross section of a magnetoresistance effect device using magnetic thin film according to the second implementation of the present invention.

Next, the second implementation with respect to a magnetoresistance effect device using a magnetic thin film of the present invention is shown. FIG. 12 is a view illustrating the cross section of a magnetoresistance effect device using magnetic thin film according to the second implementation of the present invention. FIG. 12 shows the case of a tunnel magnetoresistance effect device. As shown in the figure, a tunnel magnetoresistance effect device 50 has the structure, for example, in which $Co_2Fe_xCr_{1-x}Al$ ($0 \leq x \leq 1$) thin film 43 is provided on the substrate 42, and an insulating layer 51 as a tunnel layer, a ferromagnetic layer 52, and an antiferromagnetic layer 53 are deposited in order.

Here, the antiferromagnetic layer 53 is used to fix the spin of the ferromagnetic layer 52, for the structure of so-called spin bubble type. In this structure, $Co_2Fe_xCr_{1-x}Al$ ($0 \leq x \leq 1$) thin film 43 is called a free layer, and the ferromagnetic layer 52 a pin layer. Also, the ferromagnetic layer 52 may be the structure of either single layer or a plurality of layers. $Al_2O_3$ or $AlO_x$ as Al oxide can be used as the insulating layer 51, CoFe, NiFe, or a composite film of CoFe and NiFe as the ferromagnetic layer 54, and IrMn as the antiferromagnetic layer 53. Further, on the antiferromagnetic layer 53 of the tunnel magnetoresistance effect device 50 of the present invention, a nonmagnetic electrode layer 54 as a protective film is preferably deposited.

Figure 13:
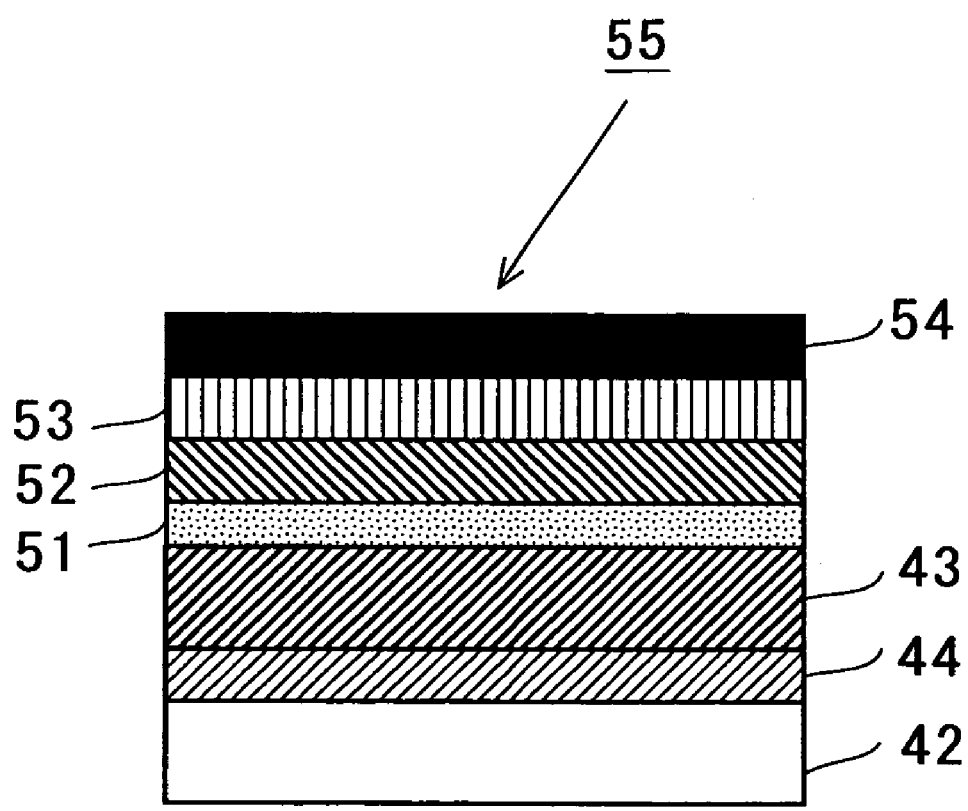
FIG. 13 is a view illustrating the cross section of a modified version of a magnetoresistance effect device using magnetic thin film according to the second implementation of the present invention.

FIG. 13 is a view illustrating the cross section of a modified version of a magnetoresistance effect device using the magnetic thin film according to the second implementation of the present invention. The tunnel magnetoresistance effect device 55 as the magnetoresistance effect device using the magnetic thin film of the present invention is provided with a buffer layer 44 and $Co_2Fe_xCr_{1-x}Al$ ($0 \leq x \leq 1$) thin film 43 onto a substrate 42, the layered structure with the insulating layer 51 as a tunnel layer, the magnetic thin film 52, the antiferromagnetic layer 53, and the nonmagnetic electrode layer 54 as protective film in this order. The difference of FIG. 13 from that of the structure in FIG. 12 is that a buffer layer 44 is further provided to the structure of FIG. 12. Other structures are the same as FIG. 12.

Figure 14:
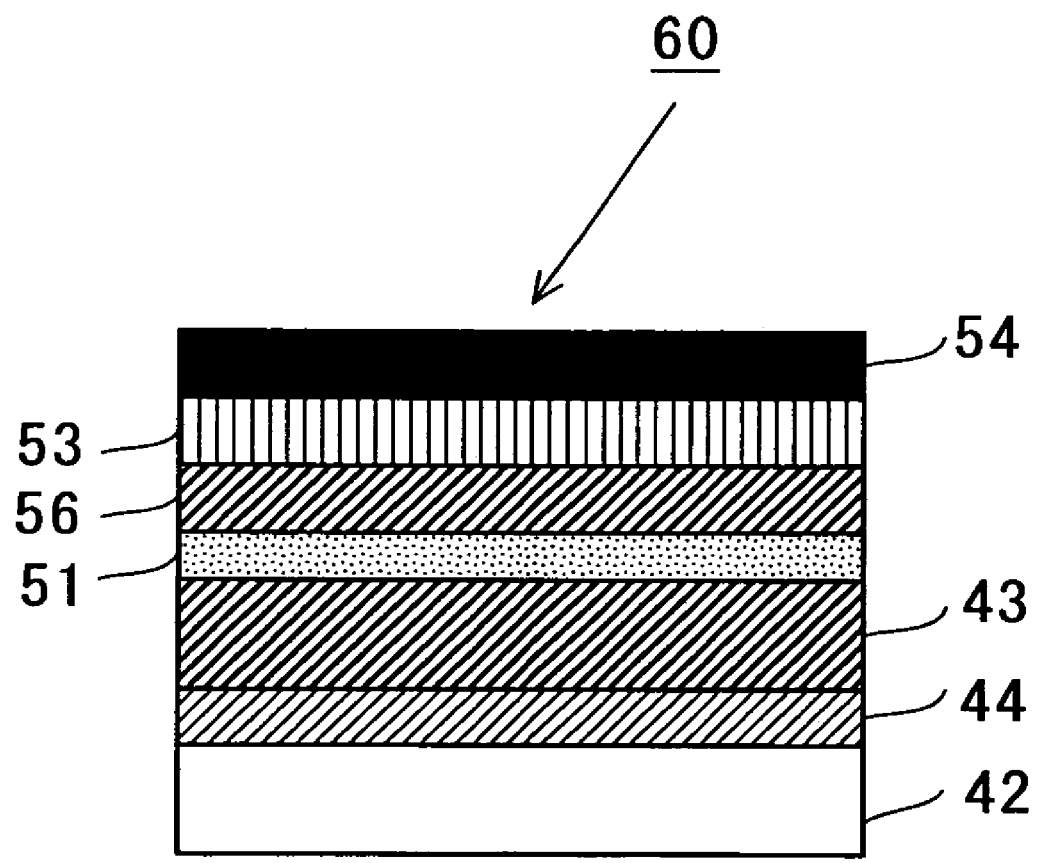
FIG. 14 is a view illustrating the cross section of a modified version of a magnetoresistance effect device using magnetic thin film according to the second implementation of the present invention.

FIG. 14 is a view illustrating the cross section of a modified version of a magnetoresistance effect device using magnetic thin film according to the second implementation of the present invention. The tunnel magnetoresistance effect device 60 as the magnetoresistance effect device using magnetic thin film of the present invention is provided with the buffer layer 44 and $CO_2Fe_xCr_{1-x}Al$ ($0 \leq x \leq 1$) thin film 43 on the substrate 42, and has the layered structure with the insulating layer 51 as a tunnel layer, $Co_2Fe_xCr_{1-x}Al$ thin film 56 ($0 \leq x \leq 1$), the antiferromagnetic layer 53, and the nonmagnetic electrode layer 54 as protective film in order. The difference of FIG. 14 from the structure of FIG. 13 is that, for a ferromagnetic layer 52, too, as a pin layer of FIG. 13, $Co_2Fe_xCr_{1-x}Al$ thin film 56 ($0 \leq x \leq 1$) as the magnetic thin film of the present invention is used. Other structures are the same as FIG. 13.

When the voltage is applied to the tunnel magnetoresistance effect devices 50, 55, and 60, it is applied between $Co_2Fe_xCr_{1-x}Al$ ($0 \leq x \leq 1$) thin film 43 or a buffer layer 44 and an electrode layer 54. The external magnetic field is applied parallel to the film surface. The electric current from a buffer layer 44 to an electrode layer 54 in the direction perpendicular to the film surface can be flown by the CPP structure.

Here, the substrate 42 to use for said tunnel magnetoresistance effect devices 50, 55, and 60 may be a thermally oxidized Si, a polycrystal such as glass, or others, or a single crystal of MgO, $Al_2O_3$, GaAs, or others. As the buffer layer 44, Al, Cu, Cr, Fe, Nb, Ni, Ta, NiFe, or others may be used. The film thickness of said $CO_2Fe_xCr_{1-x}Al$ ($0 \leq x \leq 1$) thin film 43 may be 1 nm or more and 1 μm or less. With said film thickness over 1 μm, the application as a tunnel magnetoresistance effect device becomes difficult, and not preferred. The tunnel magnetoresistance effect devices 50, 55, and 60 can be fabricated using such ordinary thin film forming methods such as a sputtering, evaporation, laser abrasion, MBE, and a masking process to form the electrode of the predesigned shape.

Next, the action of the tunnel magnetoresistance effect devices 50 and 55 as a magnetoresistance effect device using a magnetic thin film of the present invention is explained. The magnetoresistance effect devices 50 and 55 using a magnetic thin film of the present invention use two ferromagnetic layers 43 and 52, the antiferromagnetic layer 53 approaches close to one of them, and a spin valve type is used to fix the spin of the approached ferromagnetic layer 52 (a pin layer), so that when the external magnetic field is applied, only the spin of $Co_2Fe_xCr_{1-x}Al$ ($0 \leq x \leq 1$) thin film 43, which is the other ferromagnetic layer and the free layer, is inversed. Thereby, since the spin is fixed to direction 1 due to the interchange mutual action with the antiferromagnetic layer 53, the magnetization of the ferromagnetic layer 52 can easily obtain the parallel and antiparallel spin of $CO_2Fe_xCr_{1-x}Al$ ($0 \leq x \leq 1$) thin film 43, and the spin polarizability is high because the ferromagnetic layer is $CO_2Fe_xCr_{1-x}Al$ ($0 \leq x \leq 1$) thin film 43, thereby TMR of the tunnel magnetoresistance effect devices 50 and 55 of the present invention becomes very large. In this case, since the magnetization of $Co_2Fe_xCr_{1-x}Al$ ($0 \leq x \leq 1$) thin film 43 as a free layer is small, antimagnetic field is small, and magnetization reversal can be occurred with small magnetic field. Therefore, the tunnel magnetoresistance effect devices 50 and 55 of the present invention are suitable to the magnetic device requiring the magnetization reversal by such low power as MRAM.

Next, the operation of a tunnel magnetoresistance effect device 60 as a magnetoresistance effect device using a magnetic thin film of the present invention is explained.

Since the ferromagnetic layer 56 of the pin layer uses same $CO_2Fe_xCr_{1-x}Al$ ($0 \leq x \leq 1$) as the ferromagnetic thin film as used in the free layer $CO_2Fe_xCr_{1-x}Al$ ($0 \leq x \leq 1$) 43 in the tunnel magnetoresistance effect device 60, the denominator of the above mentioned Equation (1) becomes smaller, and further, the TMR of the tunnel magnetoresistance effect device of the present invention becomes larger. Therefore, the tunnel magnetoresistance effect device 60 of the present invention is suitable to the magnetic device requiring the magnetization reversal by such low power as MRAM.

Figure 15:
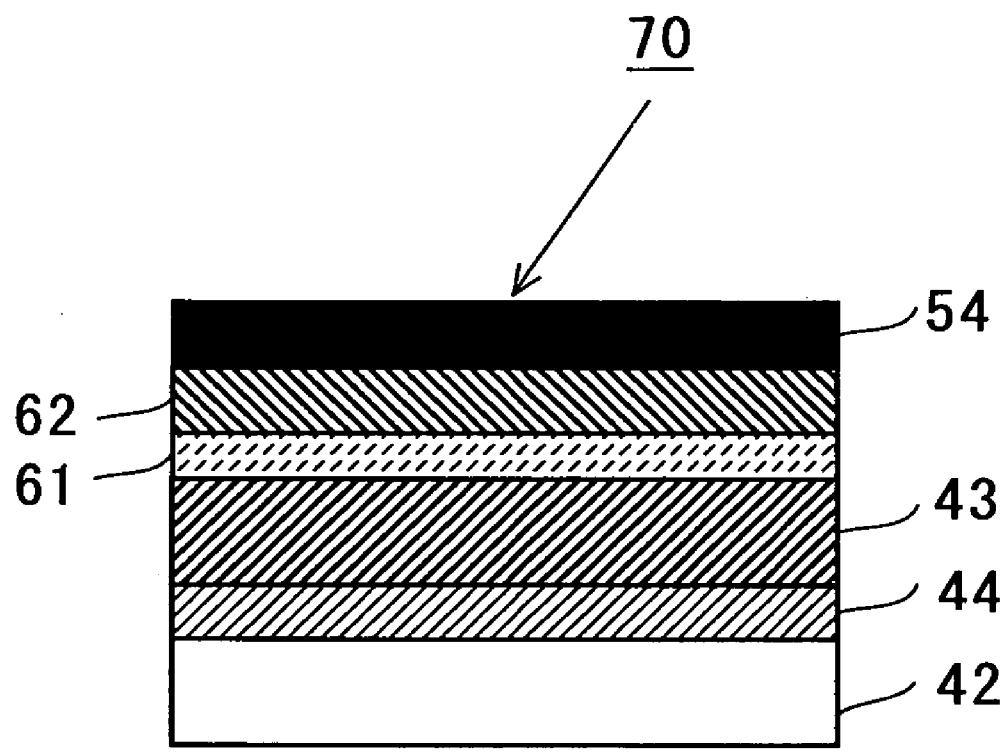
FIG. 15 is a view illustrating the cross section of a magnetoresistance effect device using magnetic thin film according to the third implementation of the present invention.

Next, the third implementation with respect to a magnetoresistance effect device using magnetic thin film of the present invention is shown. FIG. 15 is a view illustrating the cross section of a magnetoresistance effect device using magnetic thin film according to the third implementation of the present invention. The magnetoresistance effect device using magnetic thin film of the present invention shows the case of a giant magnetoresistance effect device. As is shown in the figure, the giant magnetoresistance effect device 70 is provided with the buffer layer 44 and the ferromagnetic $Co_2Fe_xCr_{1-x}Al$ ($0 \leq x \leq 1$) thin film 43 of the present invention onto the substrate 42, and has the layered structure with the nonmagnetic metal layer 61, a ferromagnetic layer 62, and a nonmagnetic electrode layer 54 as protective film in this order. A voltage is applied between the buffer layer 44 and the electrode layer 54 of the giant magnetoresistance effect device. The external magnetic field is applied parallel to the film surface. The electric current from the buffer layer 44 to the electrode layer 54 can be flown by CPP structure that is the type to flow current perpendicular to the film surface.

Figure 16:
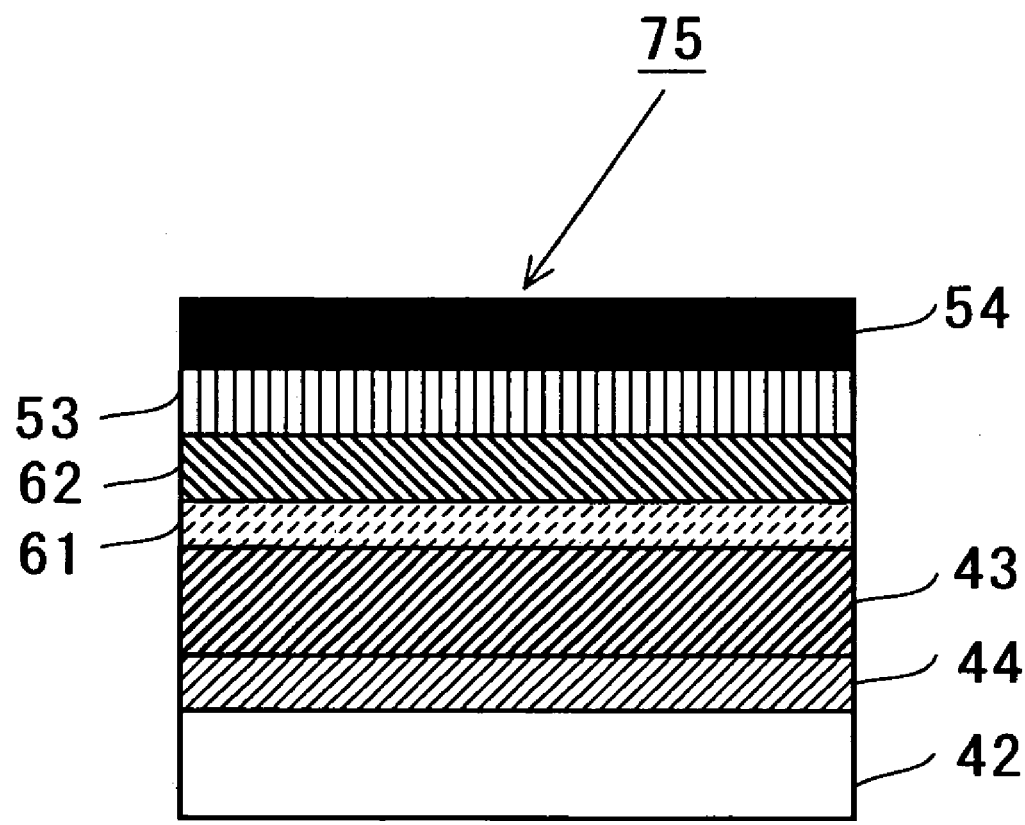
FIG. 16 is a view illustrating the cross section of a modified version of a magnetoresistance effect device using magnetic thin film according to the third implementation of the present invention.

FIG. 16 is a view illustrating the cross section of a modified version of a magnetoresistance effect device using magnetic thin film according to the third implementation of the present invention. The difference of the giant magnetoresistance effect device 75 of the present invention from the giant magnetoresistance effect device 70 in FIG. 15 is that an antiferromagnetic layer 53 is provided between the ferromagnetic layer 62 and the electrode layer 54, thereby it is made a giant magnetoresistance effect device of a spin valve type. Since other structures are same as FIG. 15, explanation is omitted.

The antiferromagnetic layer 53 functions to fix the spin of the ferromagnetic layer 62 as the nearby pin layer. Here, a voltage is applied between the buffer layer 44 and the electrode layer 54 of the giant magnetoresistance effect devices 70 and 75. The external magnetic field is applied parallel to the film surface. The electric current from the buffer layer 44 to the electrode layer 54 can be flown by CPP structure that is the type to flow current perpendicular to the film surface.

Here, as the substrate 42 of said giant magnetoresistance effect devices 70 and 75, a thermally oxidized Si, a polycrystal such as glass or others, or a single crystal of MgO, $Al_2O_3$, GaAs, or others may be used. As the buffer layer 44, Al, Cu, Cr, Fe, Nb, Ni, Ta, NiFe, or others may be used. As the nonmagnetic metal layer 61, Cu, Al, or others can be used. As the ferromagnetic layer 62, either one of CoFe, NiFe, $Co_2Fe_xCr_{1-x}Al$ ($0 \leq x \leq 1$) thin film, or others, or a composite film made of these materials may be used. And as the antiferromagnetic layer 53, IrMn or others may be used. The film thickness of said $CO_2Fe_xCr_{1-x}Al$ ($0 \leq x \leq 1$) thin film 43 may be 1 nm or more and 1 μm or less. With said film thickness less than 1 nm, it is practically difficult to make either one of $L2_1$, B2, or A2 structure. And with said film thickness over 1 μm, the application as a giant magnetoresistance effect device becomes difficult, and not preferred. The giant magnetoresistance effect devices 70 and 75 can be fabricated using such ordinary thin film forming methods such as a sputtering, evaporation, laser abrasion, MBE, and a masking process to form the electrode of the pre-designed shape.

In the giant magnetoresistance effect device 70 as the magnetoresistance effect device using magnetic thin film of the present invention, since the spin polarizability of $Co_2Fe_xCr_{1-x}Al$ ($0 \leq x \leq 0.6$) thin film 43 as a ferromagnetic layer is large, the spin dependent scattering is large, and the large magnetoresistance, that is GMR, can be attained.

In case of the giant magnetoresistance effect device 75 of spin valve type as the magnetoresistance effect device using magnetic thin film, the spin of the ferromagnetic layer 62 as a pin layer is fixed by the antiferromagnetic layer 53. And the spin of $CO_2Fe_xCr_{1-x}Al$ ($0 \leq x \leq 0.6$) thin film 43 as a free layer is made parallel or antiparallel states by the external magnetic field. Since the spin polarizability of said $CO_2Fe_xCr_{1-x}Al$ ($0 \leq x \leq 0.6$) thin film 43 is large, the spin dependent scattering is large, and since resistance is high, the lowering of GMR by the antiferromagnetic layer 53 can be suppressed.

Next, the fourth implementation with respect to a magnetic apparatus using the magnetoresistance effect device with magnetic thin film of the present invention is shown.

Figure 17:
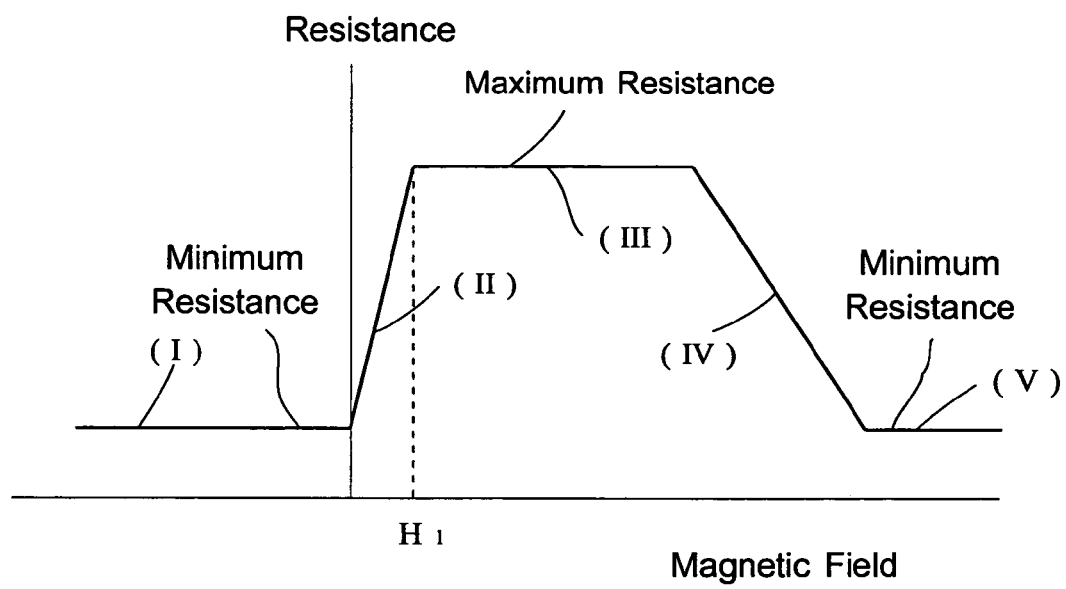
FIG. 17 is a view diagrammatically illustrating the resistance when the external magnetic field is applied to a magnetoresistance effect device using magnetic thin film according to the present invention.

As shown in FIGS. 9 to 16, TMR or GMR of various magnetoresistance effect devices using magnetic thin film of the present invention is very large at room temperature in low magnetic field. FIG. 17 is a view diagrammatically illustrating the resistance when external magnetic field is applied to a tunnel magnetoresistance effect device or a giant magnetoresistance effect device as the magnetoresistance effect device using magnetic thin film of the present invention. The abscissa of the figure is the external magnetic field applied to the magnetoresistance effect device using magnetic thin film of the present invention, and the ordinate is resistance. Here, a sufficient voltage is applied to the magnetoresistance effect device using magnetic thin film of the present invention necessary to attain giant magnetoresistance effect or tunnel magnetoresistance effect.

As is shown in the figure, the resistance of the magnetoresistance effect device using magnetic thin film of the present invention changes markedly by the external magnetic field. When external magnetic field is applied from Region (I), external magnetic field is reduced to zero, and external magnetic field is reversed and again increased, then the resistance changes from minimum to maximum from Region (II) to Region (III). Here, the external magnetic field of Region (II) is defined as $H_1$. When the external magnetic field is further increased, the resistance change is attained from Region (III) via Region (IV) to Region (V).

Thereby, in the magnetoresistance effect device using magnetic thin film of the present invention, in external magnetic field of Region (I) to Region (V), the spins of the ferromagnetic layer 62 and $Co_2Fe_xCr_{1-x}Al$ ($0 \leq x \leq 1$) thin film 43 as a free layer become parallel, and they become antiparallel in Region (III).

Here, the magnetoresistance change is expressed by the Equation (4) when external magnetic field is applied, and the larger this value, the more preferable as the magnetoresistance change.

magnetoresistance change(%)=(maximum resistance− minimum resistance)/minimum resistance    (4)

Thereby, the magnetoresistance effect device using magnetic thin film of the present invention can attain large magnetoresistance change, as shown in FIG. 17, by applying the magnetic field from zero to slightly larger than H1, that is, low magnetic field.

As explained in FIG. 17, since the magnetoresistance effect device using magnetic thin film of the present invention shows large TMR or GMR at room temperature in low magnetic field, if used as a magnetoresistance sensor, a magnetic device of high sensitivity can be obtained.

Since the magnetoresistance effect device using magnetic thin film of the present invention shows large TMR or GMR at room temperature in low magnetic field, it can be applied to the readout magnetic heads of high sensitivity, and various magnetic recording apparatuses using said magnetic heads.

MTJ devices, for example, which are the magnetoresistance effect devices using magnetic thin film of the present invention, are arranged in matrix, and are applied with the external magnetic field by flowing electric current in the separately provided interconnection. By controlling the magnetization of the ferromagnet as the free layer composing said MTJ devices to parallel or antiparallel by external magnetic field, "1" or "0" are recorded. Further by readout utilizing TMR effect, a magnetic apparatus such as MRAM can be realized.

Since GMR is large in a GMR device of CPP structure as the magnetoresistance effect devices of the present invention, large capacity of such magnetic apparatus as a hard disc drive apparatus (HDD) and MRAM can be realized.

EXAMPLE 1

Example 1 is explained next. Example 1 corresponds to the structure of the spin injection device 14 as shown in FIG. 4.

By using magnetron sputtering method, Ta (2 nm)/Cu (20 nm)/IrMn (10 nm)/$Co_{90}Fe_{10}$ (5 nm)/Cu (6 nm)/$Co_{90}Fe_{10}$ (2.5 nm)/Ru (0.45 nm)/Cu (5 nm)/Ta (2 nm) were sputtered in this order onto a thermally oxidized Si substrate. Here, the Ta and Cu layers on the thermally oxidized Si substrate and the top most layers are electrode layers. IrMn and $Co_{90}Fe_{10}$ layers are a spin polarization part 9 made of an antiferromagnetic layer 21 and a ferromagnetic fixed layer 26, respectively. Cu is an injection junction part 7. $Co_{90}Fe_{10}$ as Co alloy and Ru are a ferromagnetic free layer 27 and a nonmagnetic layer 28 provided onto Cu of a nonmagnetic layer 7.

Next, this film was microprocessed using the electron beam lithography and Ar ion milling, to fabricate a spin injection device 14 shown in FIG. 4. The device size was 300×100 nm$^2$.

Figure 18:
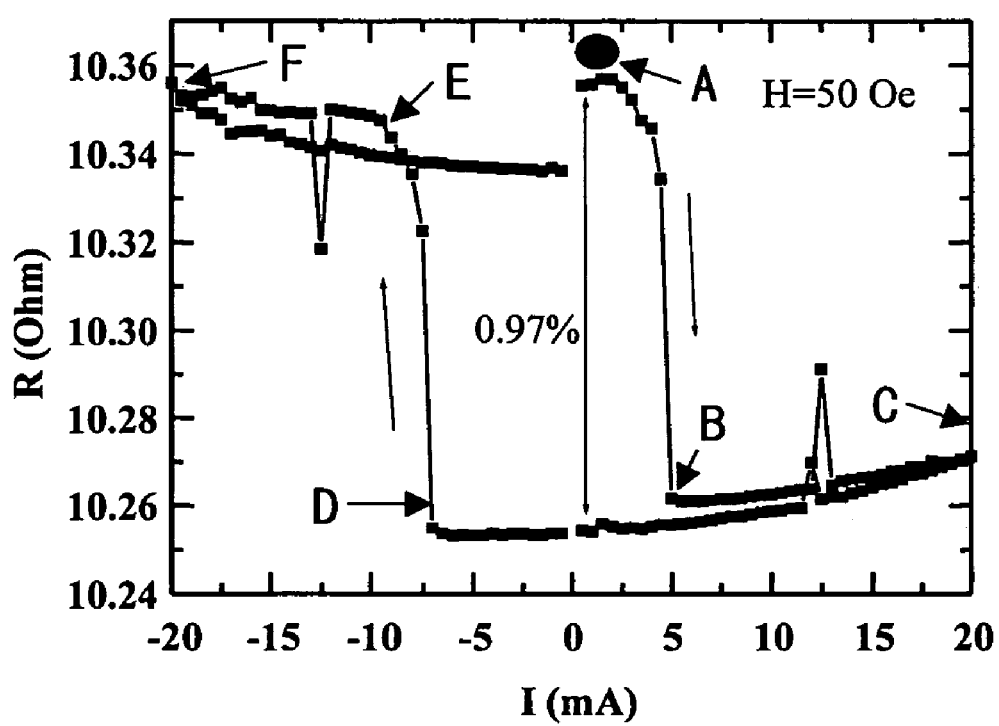
FIG. 18 is a view illustrating spin injection magnetization reversal of a spin injection device of Example 1 at room temperature.

FIG. 18 shows the spin injection magnetization reversal of a spin injection device 14 of Example 1 at room temperature. In the figure, the abscissa is the spin injection device current (mA) with the current from a ferromagnetic free layer 27 to a ferromagnetic fixed layer 26 defined as plus direction, and the ordinate is the resistance (Ω) of this case. First, an external magnetic field H was applied to the spin injection device 14, and it is defined as the antiparallel state, that is, the initial state of high resistance. The external magnetic field H of this time is 50 Oe (oersted) (Refer to A in FIG. 18). As is obvious from the figure, the resistance decreased rapidly from high resistance state of micro current shown in A when current was flown in plus direction to about 5 mA shown in B, and it is seen that magnetization reversal occurred. Further, even when current increased to 20 mA, it is seen that this low resistance state was maintained (Refer to B and C in FIG. 18).

Next, current was decreased, and applied further in minus direction, then, still down to about −7.5 mA, the low resistance state was maintained (Refer to C and D in FIG. 18). When applied with still more minus current, it turned again to high resistance state, and magnetization reversal occurred (Refer to E and F in FIG. 18). The current density required for said magnetization reversal was $2.4 \times 10^7$ A/cm$^2$, which was about 1/10 as that in the comparative example mentioned below. The magnetoresistance (MR) was, as illustrated in the figure, 0.97%, which was equal to that of the spin reversal structure of the comparative example mentioned below. Thereby, in the spin injection device 14 of Example 1, its resistance can be changed by the magnetization reversal of the ferromagnetic free layer 27 using the change of the direction of the current flown in it.

EXAMPLE 2

Example 2 is explained next. Example 2 corresponds to the structure of the spin injection device 16 as shown in FIG. 6. By using magnetron sputtering method, Ta (2 nm)/Cu (20 nm)/IrMn (10 nm)/Co$_{90}$Fe$_{10}$ (5 nm)/Cu (6 nm)/Co$_{90}$Fe$_{10}$ (2.5 nm)/Ru (6 nm)/Co$_{90}$Fe$_{10}$ (5 nm)/Cu (5 nm)/Ta (2 nm) were sputtered in this order on a thermally oxidized Si substrate. Here, the Ta and Cu layers on the thermally oxidized Si substrate and on the top most layer is the electrode layer. IrMn and Co$_{90}$Fe$_{10}$ layers are the spin polarization part 9 made of the antiferromagnetic layer 21 and the ferromagnetic fixed layer 26, respectively. Cu is the injection junction part 7. Co$_{90}$Fe$_{10}$ as Co alloy, Ru, and Co$_{90}$Fe$_{10}$ are the ferromagnetic free layer 27, the nonmagnetic layer 28, and a ferromagnetic layer 29 provided onto Cu of the nonmagnetic layer 7, respectively.

The difference of the spin injection device 16 of Example 2 from that 14 of example 1 is that the film thickness of Ru 28 on Co$_{90}$Fe$_{10}$ 27 was made thicker from 0.45 nm to 6 nm, and Co$_{90}$Fe$_{10}$ 29 of film thickness 5 nm was provided as a ferromagnetic layer 29.

Figure 19:
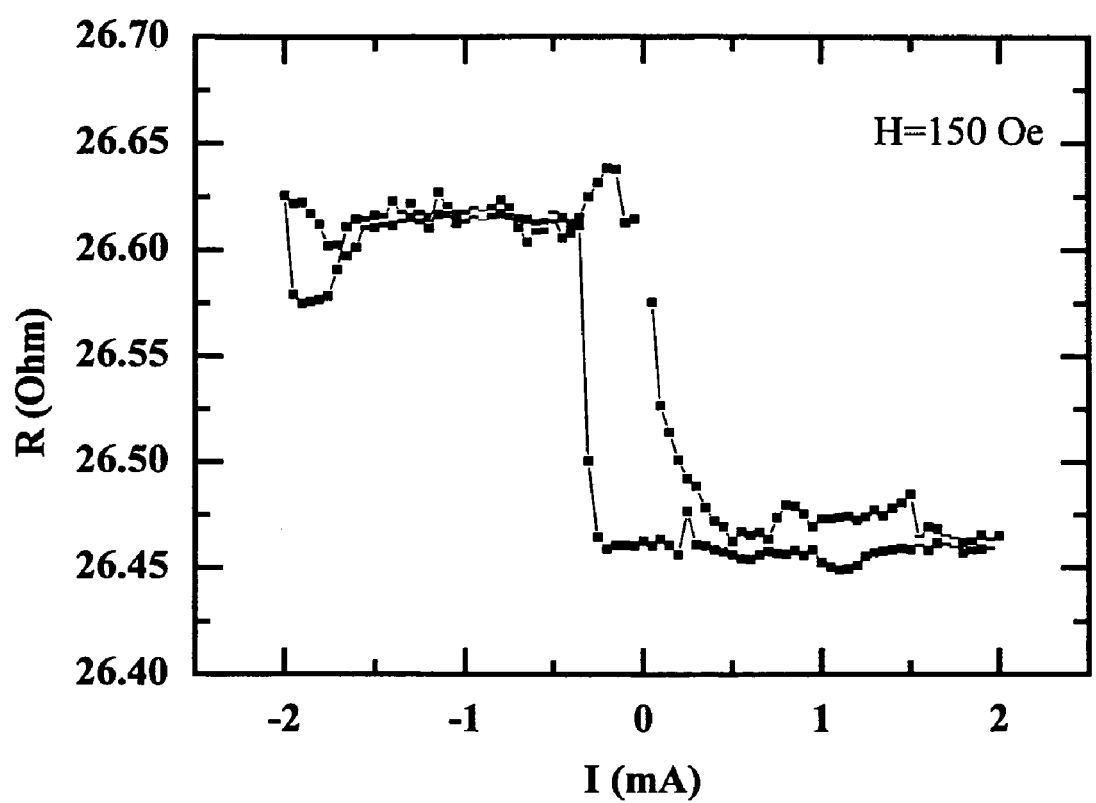
FIG. 19 is a view illustrating spin injection magnetization reversal of a spin injection device of Example 2 at room temperature.

Next, a spin injection device 16 with a device size 100×100 nm$^2$ was fabricated by the same method as in Example 1. FIG. 19 is a view illustrating spin injection magnetization reversal of a spin injection device 16 of Example 2 at room temperature. In the figure, the abscissa is the spin injection device current (mA) when the current from the ferromagnetic free layer 27 to the ferromagnetic fixed layer 26 was defined as plus, and the ordinate is resistance (Ω) at that time. The external magnetic field H applied to set the initial state of high resistance was 150 Oe. As is obvious from the figure, In the spin injection device 16 of Example 2, resistance was changed at the current±about 0.2 mA, as same as in the spin injection device 14 of Example 1, and its is seen that magnetization reversal occurred. The current density required for said magnetization reversal was $1 \times 10^6$ A/cm$^2$, which was about 1/24 as that in Example 1, and about 1/200 as that in the comparative example mentioned below. The magnetic resistance was about 1%, which was equal to the magnetoresistance (MR) of the comparative example mentioned below. Thus, by fabricating the film thickness of Ru as a nonmagnetic layer 28 to 6 nm, the current density required for magnetization reversal could be exhibited lower.

EXAMPLE 3

Example 3 is explained next. Example 3 corresponds to the structure shown in FIG. 8. By using magnetron sputtering method, Cu (100 nm)/NiFe (3 nm)/IrMn (10 nm)/Co$_{90}$Fe$_{10}$ (3 nm) was fabricated first on a thermally oxidized Si substrate, and then the 3 nm thick SiO$_2$ was sputtered on said film, and further Co$_{90}$Fe$_{10}$ (1 nm)/Ru (0.45 nm)/Co$_{90}$Fe$_{10}$ (1.5 nm)/SiO$_2$ (3 nm) were sputtered. Next, as the upper magnetic layer, Co$_{90}$Fe$_{10}$ (10 nm)/IrMn (10 nm)/Ta (5 nm) film was deposited.

As the result of transmission electron microscope observation of the cross section of said film, Co$_{90}$Fe$_{10}$ (1 nm)/Ru (0.45 nm)/Co$_{90}$Fe$_{10}$ (1.5 nm) was particulate merged layer as only one layer in SiO$_2$, and it was seen to be a double tunnel structure with SiO$_2$ as insulating matrix. In said structure, the electric current flew by applying voltage between Cu and Ta films. And the resistance at that time was observed at room temperature with current varied, then as the result, the jump of resistance was observed at about 0.1 mA. This is due to the appearance of TMR accompanying magnetization reversal of Co$_{90}$Fe$_{10}$ (1 nm)/Ru (0.45 nm)/Co$_{90}$Fe$_{10}$ (1.5 nm) SyAF, and proved that magnetization reversal occurred by spin injection.

Comparative Example

Figure 25:
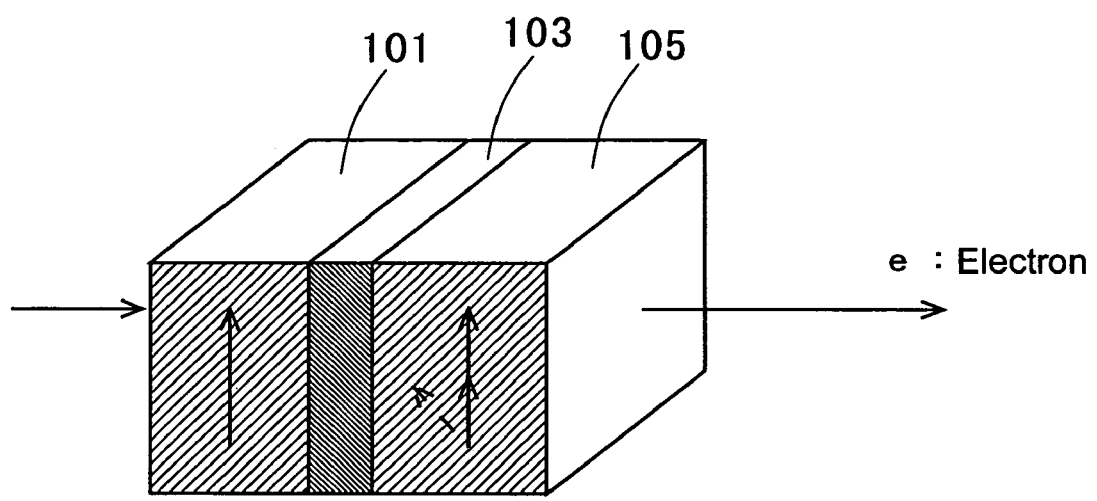
FIG. 25 is a diagrammatical view illustrating the principle of the conventional magnetization reversal.

Comparative Example is explained next. Comparative Example is the structure in which an antiferromagnetic layer was further provided on the first ferromagnetic layer 101 of the triple layer structure used for the conventional spin reversal method as shown in FIG. 25. Namely, as the structure without Ru layer in the spin injection device 14 of Example 1, Ta (2 nm)/Cu (20 nm)/IrMn (10 nm)/Co$_{90}$Fe$_{10}$ (5 nm)/Cu (6 nm)/Co$_{90}$Fe$_{10}$ (2.5 nm)/Cu (5 nm)/Ta (2 nm) were sputtered in this order onto a thermally oxidized Si substrate, followed by the same method as in Example 1 to make the device size to 300×100 nm$^2$.

Figure 20:
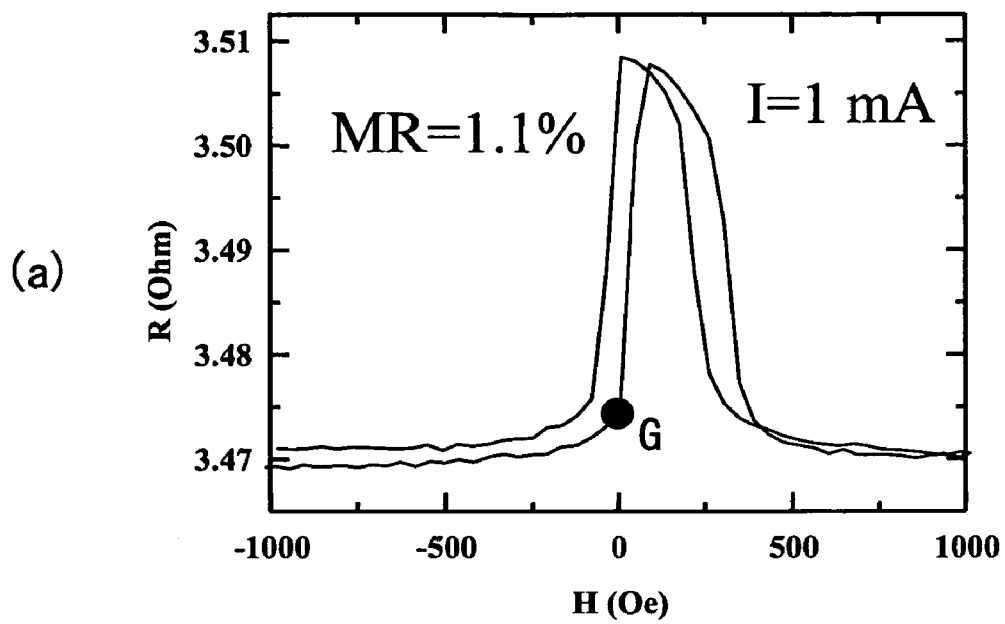
FIG. 20 is a view illustrating (a) magnetoresistance curve, and (b) spin injection magnetization reversal of Comparative Example at room temperature.
Figure 20:
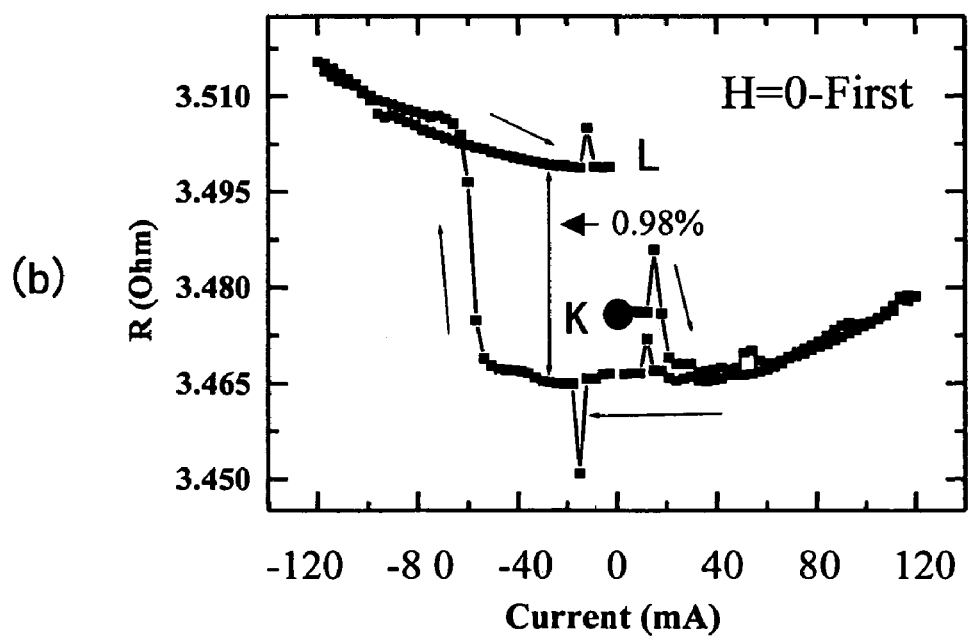

FIG. 20 is a view illustrating (a) magnetoresistance curve, and (b) spin injection magnetization reversal of Comparative Example at room temperature. In FIG. 20(a), the abscissa is the applied magnetic field (Oe), and the ordinate is resistance (Ω). The device current is 1 mA. The magnetoresistance was measured by sweeping external magnetic field from 0 (Refer to G in FIG. 20(a)). As is obvious from FIG. 20(a), the magnetoresistance (MR) of Comparative Example is 1.1% that is equal to the value reported in the past.

In FIG. 20(b), the abscissa shows the electric current (mA) with the current from the second ferromagnetic layer 103 to the first ferromagnetic layer 101 defined as plus direction, and the ordinate shows the resistance (Ω) of this case. As is obvious from FIG. 20(b) that the magnetization reversal occurred in the current direction from plus to minus through 0 as indicated by arrows (Refer to K to L in FIG. 20(b)) as same as shown in Example 1. The magnetoresistance was 0.98%, and the current density required for magnetization reversal was $2.4 \times 10^8$ A/cm$^2$.

Next, Examples 1 to 3 and Comparative Example are compared. In the Examples, the current density required for magnetization reversal was lowered than in Comparative Example. Particularly, like Example 2, when the film thickness of Ru layer 28 is within the range of 2-20 nm, the current density required for magnetization reversal is $1 \times 10^6$ A/cm$^2$, which is as low as 1/10 of the value in prior examples.

EXAMPLE 4

Figure 21:
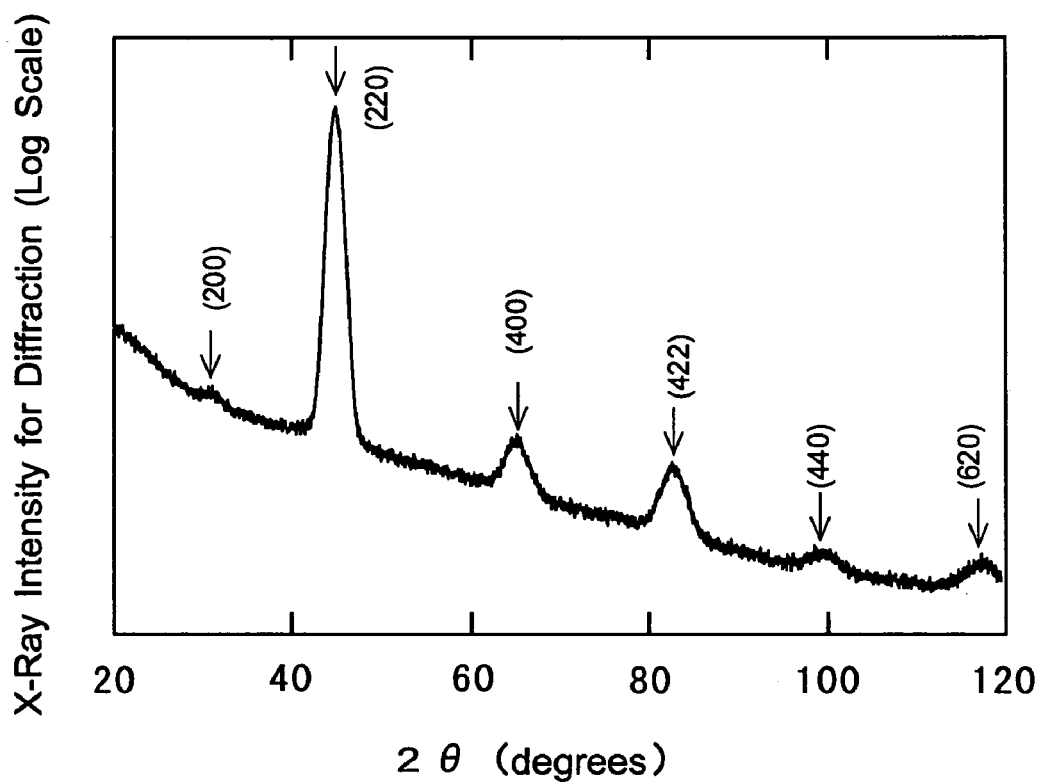
FIG. 21 is a view illustrating the observation result of X-ray diffraction of $CO_2Fe_{0.5}Cr_{0.5}Al$ thin film.

Using a high frequency sputtering apparatus, $Co_2Fe_xCr_{1-x}Al$ thin film 43 of thickness 100 nm was formed onto the thermally oxidized Si substrate 42 at various substrate temperature. FIG. 21 is a view illustrating the observation result of X-ray diffraction of $Co_2Fe_{0.5}Cr_{0.5}Al$ thin film 43. The abscissa of the figure is diffraction angle 2θ (degrees), and the ordinate is the intensity of the diffraction X-ray expressed by Log (logarithm) scale. Here, the downward arrows (↓) shown in the figure indicate diffraction intensity from each plane of the crystal of $Co_2Fe_{0.5}Cr_{0.5}Al$ thin film 43. As is shown in FIG. 21, it crystallized in the unheated substrate state, and was seen to be B2 structure with a lattice constant a=5.72 Å from the analysis of its diffraction pattern. When the substrate was heated from room temperature to 550° C., the diffraction pattern did not change much, so that it is seen to be thermally stable.

On the other hand, when $Co_2Fe_xCr_{1-x}Al$ (0≦x≦1) thin film 43 was formed on the substrate 42 using such an appropriate buffer layer 44 as Cr and Fe, or Fe substitution ratio to Cr was reduced in $Co_2Fe_xCr_{1-x}Al$ (0≦x≦1) thin film 43, the diffraction X-ray peak of (111) plane was confirmed near 2θ=27 degrees. This suggests that $Co_2Fe_xCr_{1-x}Al$ (0≦x≦1) thin film 43 has $L2_1$ structure.

Figure 22:
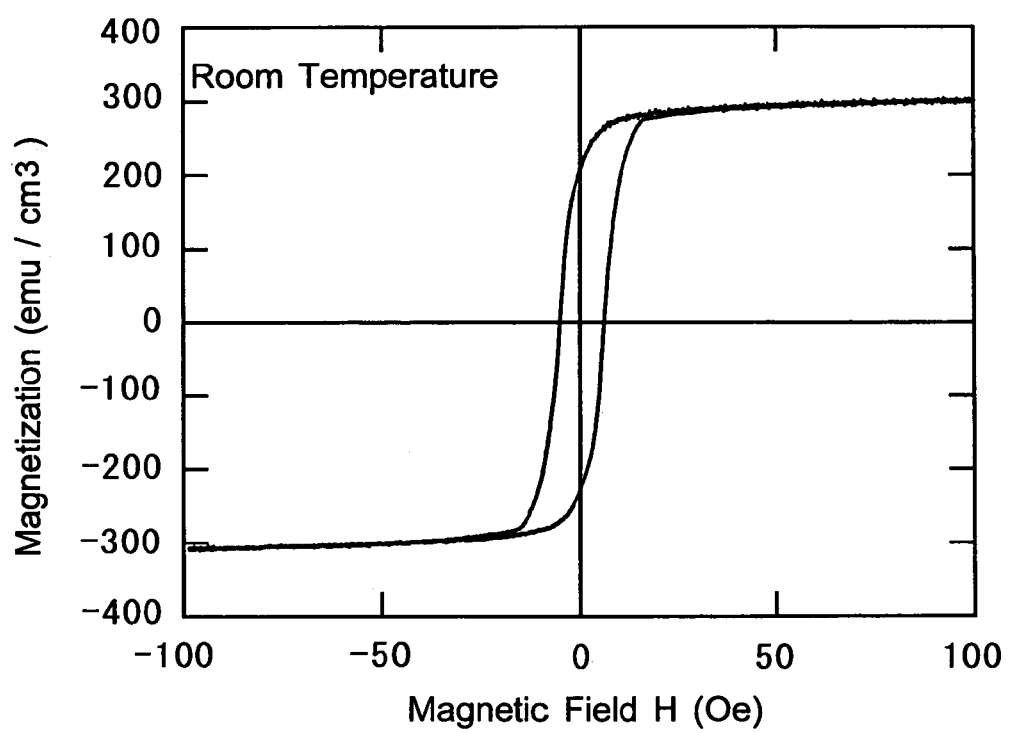
FIG. 22 is a view illustrating the magnetization property of $Co_2Fe_{0.5}Cr_{0.5}Al$ thin film at room temperature.

The magnetic property of $Co_2Fe_{0.5}Cr_{0.5}Al$ thin film 43 as shown in FIG. 21 is explained next. FIG. 22 is a view illustrating the magnetization property of $Co_2Fe_{0.5}Cr_{0.5}Al$ thin film 43 at room temperature. The abscissa of the figure is magnetic field H (Oe), and the ordinate is magnetization (emu/cm$^3$). As illustrated, $Co_2Fe_{0.5}Cr_{0.5}Al$ thin film 43 shows hysteresis, and is a ferromagnet. From the figure, it is seen that the saturation magnetization is about 300 emu/cm$^3$, and the magnetic coercive force is 5 oersted (Oe). The magnetic thin films 41 and 45 were formed using the same $Co_2Fe_{0.5}Cr_{0.5}Al$ thin film 43 at various temperatures of the substrate 42, but the saturation magnetization and the magnetic coercive force hardly changed up to 400° C.

This fact suggests that $Co_2Fe_{0.5}Cr_{0.5}Al$ thin film 43 of B2 structure having good crystal quality can be obtained at room temperature, and the measuring result of the electric resistance of $Co_2Fe_{0.5}Cr_{0.5}Al$ thin film 43 showed that it was about 190 μΩcm at room temperature. This value is equivalent to 200 μΩcm of the antiferromagnet IrMn.

Similarly, $Co_2Fe_xCr_{1-x}Al$ (0≦x≦1) thin film 43 was formed at room temperature with x=0, 0.4, 0.6, and 1.0. Thus formed $Co_2Fe_xCr_{1-x}Al$ thin films 43 were evaluated by X-ray diffraction, and obtained films had either one of the structures $L2_1$, B2, and A2. Further, the electric resistance of $Co_2Fe_xCr_{1-x}Al$ thin film 43 showed the tendency of decrease with increasing x of composition, and it was about 100 μΩcm at x=1.0.

EXAMPLE 5

A tunnel magnetoresistance effect device 55 of spin valve type as shown in FIG. 13 was fabricated at room temperature. Cr (5 nm)/$Co_2Fe_{0.4}Cr_{0.6}Al$ (10 nm)/AlO$_x$ (1.2 nm)/CoFe (5 nm)/NiFe (5 nm)/IrMn (10 nm)/Cr (5 nm) were deposited in this order onto a thermally oxidized substrate 42, with Cr as a buffer layer 44 using a high frequency sputtering apparatus and a metal mask, thereby a tunnel magnetoresistance effect device 55 was fabricated. The numerals in parentheses are respective film thicknesses.

Cr is a buffer layer 44, $Co_2Fe_{0.4}Cr_{0.6}Al$ thin film 43 is a ferromagnetic free layer, AlO$_x$ is a tunnel insulating layer 51, CoFe and NiFe are the ferromagnets made of the composite films of pin layers of ferromagnetic layers 52, IrMn is the antimagnetic layer 53, and has a role to fix the spin of CoFe/NiFe ferromagnetic layer 52. And Cr on IrMn as the antimagnetic layer 53 is the protective film 54. In this case, magnetic field of 100 Oe was applied upon film forming, and monoaxis anisotropy was introduced into film surface.

Figure 23:
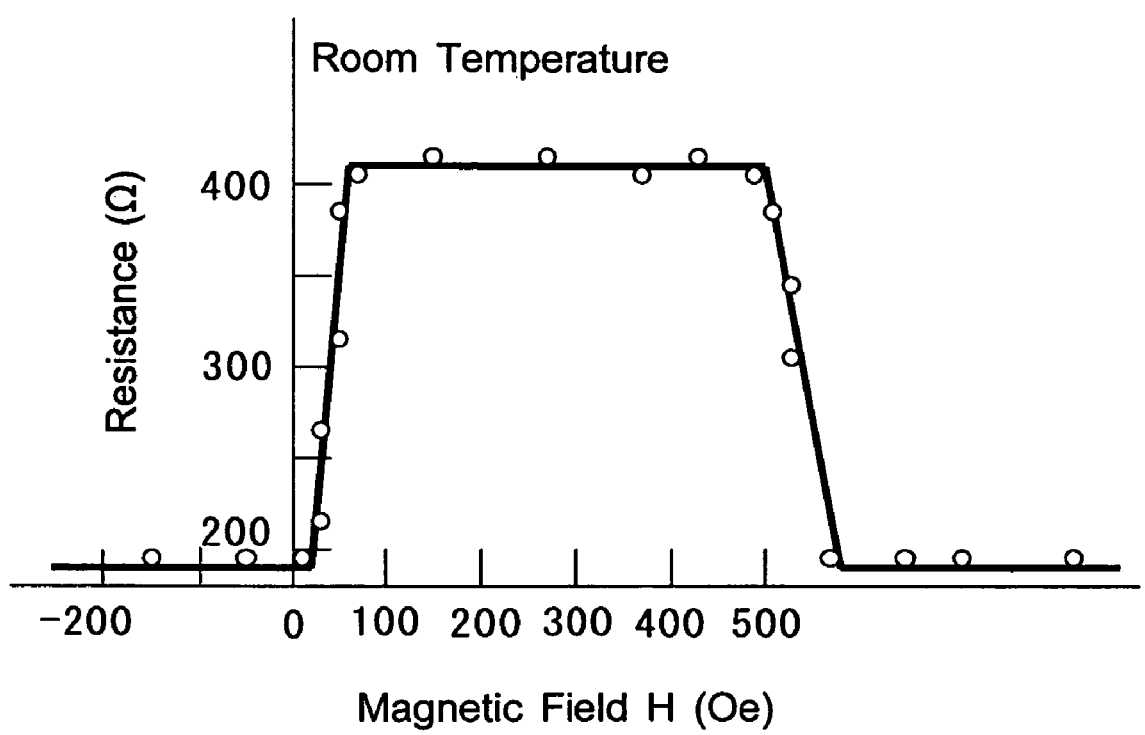
FIG. 23 is a view illustrating the magnetic field dependency of the resistance of a tunnel magnetoresistance effect device shown in FIG. 13.

The external magnetic field was applied to the tunnel magnetoresistance effect device 55, and the magnetoresistance was measured at room temperature. FIG. 23 is a view illustrating the magnetic field dependency of the resistance of a tunnel magnetoresistance effect device 55. The abscissa of the figure is external magnetic field H (Oe), and the ordinate is resistance (Ω). From this, TMR was determined as 107%. TMR attained by the tunnel magnetoresistance effect device 55 of the present invention is remarkably large, compared with TMR of conventional tunnel magnetoresistance effect devices as at most about 50%, and the spin polarizability of $Co_2Fe_{0.4}Cr_{0.6}Al$ thin film was found to be as high as about 0.7.

EXAMPLE 6

A tunnel magnetoresistance effect device 55 of the spin valve type was manufactured, as in Example 5 except for using Fe of 20 nm as a buffer layer 44 and $Co_2Fe_{0.6}Cr_{0.4}Al$ thin film 3. The external magnetic field was applied to the tunnel magnetoresistance effect device 55, and magnetoresistance was measured. As the result, TMR of 92% was attained. From this result, the spin polarizability of $Co_2Fe_{0.6}Cr_{0.4}Al$ thin film turned out to be high.

EXAMPLE 7

A tunnel magnetoresistance effect device 50 of spin valve type was manufactured, as same as Example 6 without using a buffer layer 44. $Co_2Fe_{0.4}Cr_{0.6}Al$ magnetic thin film of this case had B2 structure. The magnetoresistance was measured at room temperature after the external magnetic field was applied to said tunnel magnetoresistance effect device 55.

Figure 24:
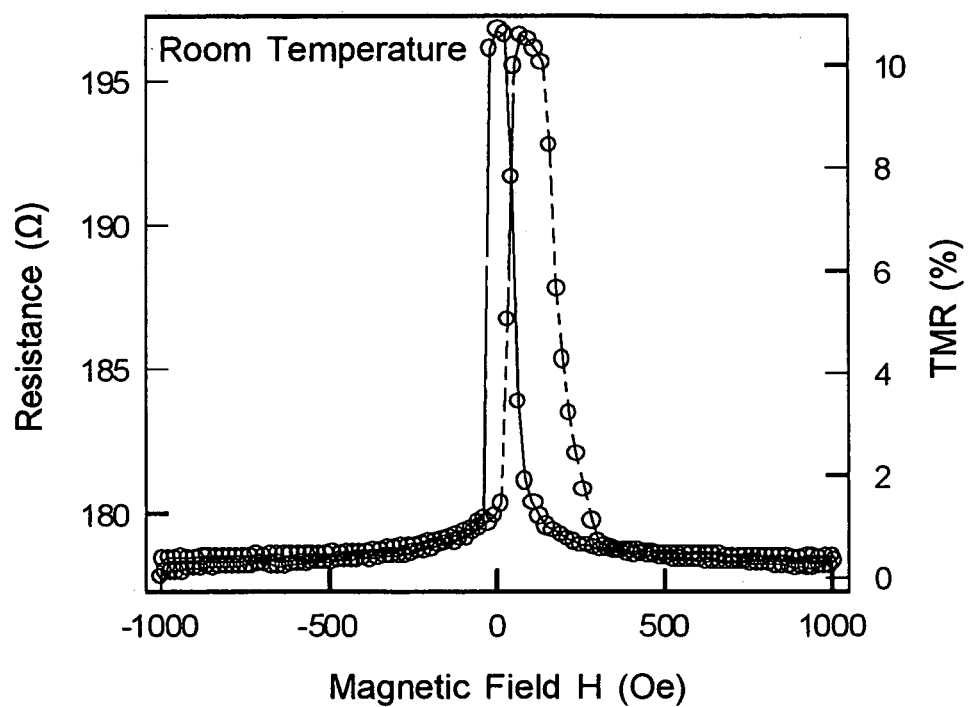
FIG. 24 is a view illustrating the magnetic field dependency of the resistance of a tunnel magnetoresistance effect device shown in FIG. 12.

FIG. 24 is a view illustrating the magnetic field dependency of the magnetoresistance of a tunnel magnetoresistance effect device 50. The abscissa of the figure is the external magnetic field H (Oe), the left-side ordinate is resistance (Ω), and the right-side ordinate is TMR (%) calculated from the observed resistance. Solid lines and dotted lines show the resistance values for the swept external magnetic field. From this, TMR of about 11% at room temperature, and of 32% at 77 K were attained. $Co_2Fe_{0.4}Cr_{0.6}Al$ magnetic thin film 43 of this case had B2 structure, and from the fact that, though a buffer layer 44 was not used, such relatively large TMR was attained at room temperature, it is seen that $Co_2Fe_{0.4}Cr_{0.6}Al$ magnetic thin film of B2 structure, too, had high spin polarizability.

EXAMPLE 8

A tunnel magnetoresistance effect device 50 of spin valve type was fabricated, as same as Example 6, using $Co_2FeAl$ magnetic thin film 43 and without using a buffer layer 44. $Co_2FeAl$ magnetic thin film 43 of this case had A2 structure. The external magnetic field was applied to the tunnel magnetoresistance effect device 50, and magnetoresistance was measured at room temperature and as low temperature as 5 K. As the result, TMR of 8% at room temperature and 42% at low temperature was attained. This implies that $Co_2FeAl$ magnetic thin film of A2 structure, too, has large spin polarizability.

EXAMPLE 9

A tunnel magnetoresistance effect device 50 of magnetic coercive force difference type $Co_2FeAl$ (10 nm)/$AlO_x$ (1.4 nm)/CoFe (3 nm)/Ta (10 nm) was fabricated onto a thermally oxidized Si substrate at room temperature without using a buffer layer 44. Here, the numerals in parentheses indicate respective film thicknesses. Said tunnel magnetoresistance effect device of magnetic coercive force difference type means the tunnel magnetoresistance effect device utilizing the difference of magnetic coercive force between $Co_2FeAl$ and CoFe as ferromagnets. In TMR of said tunnel magnetoresistance effect device 50 of magnetic coercive force difference type, like a tunnel magnetoresistance effect device of spin valve type, the difference in magnetoresistance appears depending upon whether magnetization is parallel or antiparallel to each other.

The value of TMR obtained by the fabricated tunnel magnetoresistance effect device of magnetic coercive force difference type was 8% at room temperature, and 42% at low temperature of 5 K. Here, the crystal structure of $CO_2FeAl$ thin film 43 formed on the thermally oxidized Si substrate without heating the substrate was A2 structure.

Next, said magnetoresistance effect device was heat treated in vacuum at various temperatures, and respective TMR properties were measured. As a result, TMR of 1 hour heat treatment at 300° C. was 28% at room temperature, and 55% at low temperature of 5 K which was remarkably higher than TMR of room temperature fabricated device. The crystal structure of $CO_2FeAl$ thin film of this case was observed by X-ray diffraction, and turned out to have $L2_1$ structure. Therefore, the improvement of TMR by said heat treatment was due to the crystal structure of $Co_2FeAl$ thin film changed from A2 to $L2_1$ structure, and it implies that the spin polarizability of $L2_1$ structure is larger than that of A2 structure.

EXAMPLE 10

A tunnel magnetoresistance effect device 50 of the spin valve type was fabricated as same as Example 5, except for using GaAs as a substrate 44. $CO_2Fe_{0.4}Cr_{0.6}Al$ magnetic thin film 43 of this case had $L2_1$ structure. The external magnetic field was applied to said tunnel magnetoresistance effect device 50, and the magnetoresistance was measured at room temperature. As a result, TMR as large as 125% was attained at room temperature, which implies the spin polarizability of $CO_2Fe_{0.4}Cr_{0.6}Al$ magnetic thin film of $L2_1$ structure is quite large.

EXAMPLE 11

A giant magnetoresistance effect device 75 of spin valve type shown in FIG. 16 was manufactured at room temperature. Using a high frequency sputtering apparatus and a metal mask, Al (100 nm)/$Co_2Fe_{0.5}Cr_{0.5}Al$ (5 nm)/Cu (6 nm)/$Co_2Fe_{0.5}Cr_{0.5}Al$ (5 nm)/NiFe (5 nm)/IrMn (10 nm)/Al (100 nm) were deposited in this order onto the thermally oxidized Si substrate, thereby the multi layer structure of a giant magnetoresistance effect device of the spin valve type was fabricated. The numerals in parentheses are respective film thicknesses.

Here, Al is a buffer layer 44, $CO_2Fe_{0.5}Cr_{0.5}Al$ is a thin film 43 as a free layer, and Cu is a nonmagnetic metal layer 61 to realize giant magnetoresistance effect. The double layer structure of $CO_2Fe_{0.5}Cr_{0.5}Al$ (5 nm) and NiFe (5 nm) is the ferromagnetic layer 62 as a pin layer. IrMn is the antiferromagnetic layer 53, and has a role to fix spins of the ferromagnetic layer 62 as a pin layer. Al layer on the top-most layer is the electrode layer 54. Here, upon film forming, monoaxis anisotropy was introduced in film surface by applying magnetic field of 100 Oe. Said deposited multi layered film was microprocessed using the electron beam lithography and Ar ion milling apparatus, thereby the giant magnetoresistance effect device 75 of 0.5 μm×1 μm was fabricated.

The voltage was applied between the upper and lower electrodes 44 and 54 of said device, the electric current flew in the direction perpendicular to film surface, the external magnetic field was applied, and the magnetoresistance was measured at room temperature. Thereby, magnetoresistance of about 8% was attained. This value is 8 times as remarkably large as the magnetoresistance of the giant magnetoresistance effect device of CPP structure of the conventional spin valve type being lower than 1%. It turned out from this result that the reason why GMR of the giant magnetoresistance effect device of CPP structure of the present invention is remarkably large compared with that of the giant magnetoresistance effect device of CPP structure of the conventional spin valve type is attributed to the high spin polarizability of $CO_2Fe_{0.5}Cr_{0.5}Al$ thin film 43.

Further, another reason why such large GMR was attained was found to be contributed by the fact that, as mentioned above, resistivity of $Co_2Fe_{0.5}Cr_{0.5}Al$ thin film used as a pin layer and a free layer was equal to that of an antiferromagnetic layer 53 using IrMn.

It should be understood that the invention is by no way limited to the specific examples thereof set forth above, but to include all possible modifications that can be made within the scope with respect to the features specifically set forth in the appended claims and to encompass all the equivalents thereof.

INDUSTRIAL APPLICABILITY

A spin injection device of the present invention is capable of exhibiting the magnetization reversal with a low current density. Also, a spin injection magnetic apparatus of the present invention is capable of realizing the magnetization reversal of a free layer of MTJ by spin injection with even lower current density. Therefore, it is applicable to such various magnetic apparatuses and magnetic memory devices as super gigabit large capacity, high speed, non-volatile MRAM and the like.

Also, in accordance with the present invention, the magnetic thin film using $Co_2Fe_xCr_{1-x}Al$ ($0 \leq x \leq 1$) of either one of $L2_1$, B2, or A2 structures can be fabricated at room temperature without heating. Further, it shows the ferromagnetic property and the high spin polarizability.

Also, with a giant magnetoresistance effect device using $Co_2Fe_xCr_{1-x}Al$ ($0 \leq x \leq 1$) of either one of $L2_1$, B2, or A2 structures, extremely large GMR can be attained at room temperature in low external magnetic field. Also with a tunnel magnetoresistance effect device, quite large TMR can be similarly attained.

Further by applying various magnetoresistance effect devices of the present invention using $CO_2Fe_xCr_{1-x}Al$ ($0 \leq x \leq 1$) of either one of $L2_1$, B2, or A2 structures to such various magnetic apparatuses as the magnetic heads of super gigabit large capacity and high speed, or non-volatile and high speed MRAM and the like, novel magnetic apparatuses can be realized. In this case, since the saturation magnetization is small, the magnetic switching field by spin injection becomes small, and magnetization reversal can be realized with low power consumption, as well as it is applicable as the key material to open widely the field of spin electronics, as efficient spin injection to semiconductors becomes possible, and development of spin FET is also possible.

What is claimed is:

1. A method for operating a spin injection device which includes a spin injection part having a spin polarizing part and an injection junction part, and SyAF having a first magnetic layer and a second magnetic layer having different magnitudes of magnetization, and magnetically coupled together antiparallel to each other via a nonmagnetic layer, said first magnetic layer of SyAF and said injection junction part are bonded, said method comprising:
injecting a spin polarization electron from said spin injection part by flowing electric current between said spin polarizing part and said second magnetic layer, wherein magnetization of said first and second magnetic layers is reversed while maintained in antiparallel state without applying an external magnetic field, and wherein said flowing electric current is 1 mA or less.

2. The method of operating a spin injection device as set forth in claim 1, wherein the injection junction part of said spin injection part is either a nonmagnetic conductive layer or a nonmagnetic insulating layer.

3. The method of operating a spin injection device as set forth in claim 1 or claim 2, wherein said spin polarization electron is capable of spin conservation conduction or tunnel junction at the injection junction part of said spin injection part.

4. The method of operating a spin injection device as set forth in claim 1 or claim 2, wherein the spin polarization part of said spin injection part is a ferromagnetic layer.

5. The method of operating a spin injection device as set forth in claim 1 or claim 2, wherein the spin polarization part of said spin injection part is provided in contact with an antiferromagnetic layer that fixes the spin of a ferromagnetic layer.

6. The method of operating a spin injection device as set forth in claim 1 or claim 2, wherein the aspect ratio of the first and the second magnetic layers of SyAF in contact with the injection junction part of said spin injection parts is less than 2.

7. A method of operating a spin injection magnetic apparatus which includes a free layer having a first magnetic layer and a second magnetic layer coupled together magnetically antiparallel to each other via a nonmagnetic layer, and in which magnitudes of magnetization are different, and the magnetization of said first magnetic layer and said second magnetic layer is capable of magnetization reversal while maintaining the antiparallel state, and
a ferromagnetic fixed layer tunnel functioned with the first magnetic layer of said free layer via an insulating layer, wherein:
said ferromagnetic fixed layer and said free layer are made to be a ferromagnetic spin tunnel junction, said method comprising:
reversing the magnetization of said first and second magnetic layers by flowing electric current between said second magnetic layer of the free layer and said ferromagnetic fixed layer while maintained in an antiparallel state without applying an external magnetic field, and wherein said flowing electric current is 1 mA or less.

8. The method of operating a spin injection magnetic apparatus as set forth in claim 7, wherein said spin injection magnetic apparatus it is provided with, in addition to the above-mentioned aspects, a spin injection part having an injection junction part connected to said free layer and a spin polarization part.

9. The method of operating a spin injection magnetic apparatus as set forth in claim 8, wherein the injection junction part of said spin injection part is either a nonmagnetic conductive layer or a nonmagnetic insulating layer.

10. The method of operating a spin injection magnetic apparatus as set forth in claim 8 or claim 9, wherein a spin polarization electron is capable of spin conservation conduction or tunnel junction at the injection junction part of said spin injection part.

11. The method of operating a spin injection magnetic apparatus as set forth in claim 8 or claim 9, wherein the spin polarization part of said spin injection part is a ferromagnetic layer.

12. The method of operating a spin injection magnetic apparatus as set forth in claim 8 or claim 9, wherein the spin polarization part of said spin injection part is provided in contact with an antiferromagnetic layer that fixes the spin of a ferromagnetic layer.

13. The method of operating a spin injection magnetic apparatus as set forth in claim 8 or claim 9, wherein said spin injection part is word line.

14. The method of operating a spin injection magnetic apparatus as set forth in any one of claim 7, 8 or 9, wherein the aspect ratio of the first and the second magnetic layers of the free layer in contact with the injection junction part of said spin injection part is less than 2.

15. A method of operating a spin injection device including
a spin injection part having a spin polarization part including a ferromagnetic fixed layer and an injection junction part of a nonmagnetic layer,
a ferromagnetic free layer provided in contact with said spin injection part, and
a nonmagnetic layer provided on the surface of said ferromagnetic free layer, wherein:
said nonmagnetic layer of the injection junction part is made of an insulator or a conductor, said method comprising:
reversing the magnetization of said ferromagnetic free layer by flowing electric current between the spin polarization part and said nonmagnetic layer provided on the surface of said ferromagnetic free layer in the direction perpendicular to the film surface without applying an external magnetic field, and wherein said flowing electric current is 1 mA or less.

16. The method of operating a spin injection device as set forth in claim 15, wherein said ferromagnetic free layer is made of Co or Co alloy, a nonmagnetic layer provided on the surface of said ferromagnetic free layer is a Ru layer, and its film thickness is 0.1-20 nm.

17. A method of operating a spin injection device including
a spin injection part having a spin polarization part including a ferromagnetic fixed layer and an injection junction part of a nonmagnetic layer, and
a ferromagnetic free layer provided in contact with said spin injection part, and
a nonmagnetic layer and a ferromagnetic fixed layer provided on the surface of said ferromagnetic free layer, wherein:
said nonmagnetic layer of the injection junction part is made of an insulator or a conductor, said method comprising:
reversing the magnetization of said ferromagnetic free layer by flowing electric current between the spin polarization part and the ferromagnetic fixed layer provided on the surface of said ferromagnetic free layer in the direction perpendicular to the film surface without applying external magnetic field, and wherein said flowing electric current is 1 mA or less.

18. The method of operating a spin injection device as set forth in claim 17, wherein said ferromagnetic free layer and said ferromagnetic layer are made of Co or Co alloy, a nonmagnetic layer provided on the surface of said ferromagnetic free layer is a Ru layer, and its film thickness is 2-20 nm.

* * * * *